United States Patent
Colson et al.

(10) Patent No.: US 7,090,743 B2
(45) Date of Patent: *Aug. 15, 2006

(54) PRESSURE LAMINATOR APPARATUS

(75) Inventors: Wendell B. Colson, Weston, MA (US); Kevin Dann, Denver, CO (US)

(73) Assignee: Hunter Douglas Inc., Upper Saddle River, NJ (US)

( * ) Notice: Subject to any disclaimer, the term of this patent is extended or adjusted under 35 U.S.C. 154(b) by 0 days.

This patent is subject to a terminal disclaimer.

(21) Appl. No.: 10/884,037

(22) Filed: Jul. 1, 2004

(65) Prior Publication Data

US 2005/0067113 A1    Mar. 31, 2005

Related U.S. Application Data

(63) Continuation-in-part of application No. 10/088,576, filed as application No. PCT/US00/25680 on Sep. 20, 2000, now Pat. No. 6,805,771.

(60) Provisional application No. 60/155,364, filed on Sep. 20, 1999.

(51) Int. Cl.
*B30B 5/06*    (2006.01)

(52) U.S. Cl. .................... 156/583.5; 156/498; 156/499; 156/555

(58) Field of Classification Search ................ 156/498, 156/499, 555, 580, 582, 583.1, 583.5; 100/151, 100/154, 307, 310, 312; 425/371

See application file for complete search history.

(56) References Cited

U.S. PATENT DOCUMENTS

| | | | |
|---|---|---|---|
| 1,338,164 A | 4/1920 | Angier | |
| 1,518,120 A | 12/1924 | Rhoades | 28/176 |
| 1,951,301 A | 3/1934 | Angier et al. | 154/1 |
| 2,093,206 A | 9/1937 | Muller | 57/7 |
| 2,797,728 A | 7/1957 | Slayter et al. | 154/1.7 |
| 3,041,230 A | 6/1962 | Diehl | 156/172 |
| 3,493,455 A | 2/1970 | Le Bolt et al. | 28/101 |
| 3,496,053 A | 2/1970 | Bascom et al. | 161/57 |
| 3,538,564 A | 11/1970 | Skoler et al. | 28/72.2 |
| 3,591,434 A | 7/1971 | Hartstein | 156/178 |
| 3,663,331 A | 5/1972 | Solbeck | 156/181 |
| 3,686,048 A | 8/1972 | Schirtzinger | 156/161 |

(Continued)

FOREIGN PATENT DOCUMENTS

CA    889808    1/1972

(Continued)

*Primary Examiner*—James Sells
(74) *Attorney, Agent, or Firm*—Dorsey & Whitney LLP

(57) ABSTRACT

An apparatus for laminating at least two sheets of material includes a supply station at which rolls of the sheet material are rotatably supported, a laminating station in which the materials are laminated together with heat and compression and a take-up station where the laminate is accumulated on a take-up roll. The laminating station includes upper and lower sections of a pressure box between which upper and lower endless drive belts pass which entrap the laminate materials therebetween and transfer the materials through the lamination station. Heating and cooling sections of the pressure box are provided with floating heating and cooling bars and a single underlying heating plate and a single underlying cooling plate. A pneumatic inflatable seal extends around the periphery of the pressure box between the upper and lower sections thereof to establish a hermetic seal that includes an inflatable bladder positioned within a flexible low-friction strip of material which is slidably engaged with one of the drive belts. The other drive belt slides along another strip of low friction material and against which the inflatable bladder compresses the belts.

19 Claims, 17 Drawing Sheets

U.S. PATENT DOCUMENTS

| | | | |
|---|---|---|---|
| 3,736,210 A | 5/1973 | Kaczerginski | 242/441.2 |
| 3,737,950 A | 6/1973 | Bolliand et al. | 19/65 T |
| 3,753,842 A | 8/1973 | Pittman | 161/57 |
| 3,950,583 A | 4/1976 | Patin | 28/101 |
| 4,132,828 A | 1/1979 | Nakamura et al. | 428/366 |
| 4,202,718 A | 5/1980 | Mizutani et al. | 156/171 |
| 4,265,691 A | 5/1981 | Usui | 156/172 |
| 4,411,722 A | 10/1983 | Yazawa et al. | 156/167 |
| 4,460,633 A | 7/1984 | Kobayashi et al. | 428/110 |
| 4,498,941 A | 2/1985 | Goldsworthy | 156/148 |
| 4,511,424 A | 4/1985 | Usui | 156/426 |
| 4,578,141 A | 3/1986 | Gidge et al. | 156/439 |
| 4,687,528 A | 8/1987 | Held | 156/150 |
| 4,794,855 A | 1/1989 | Okajima et al. | 100/154 |
| 4,906,784 A | 3/1990 | Skoler | 528/125 |
| 5,061,545 A | 10/1991 | Li et al. | 428/195 |
| 5,097,783 A | 3/1992 | Linville | 114/103 |
| 5,536,356 A | 7/1996 | Stuerzel | 156/514 |
| 5,558,016 A | 9/1996 | De Brock | 100/93 P |
| 5,836,241 A * | 11/1998 | Horton | 100/311 |
| 5,965,262 A | 10/1999 | Whisler et al. | 428/373 |
| 6,227,271 B1 | 5/2001 | Pourmand et al. | 156/498 |
| 6,494,980 B1 | 12/2002 | Röthemeyer et al. | 156/169 |
| 6,805,771 B1 | 10/2004 | Colson et al. | 156/583.5 |
| 2003/0051795 A1 | 3/2003 | Burgess | 156/169 |
| 2003/0233744 A1 | 12/2003 | Colson et al. | 28/190 |
| 2004/0074591 A1 | 4/2004 | Colson et al. | 156/174 |

FOREIGN PATENT DOCUMENTS

| | | |
|---|---|---|
| DE | 30 46 432 | 8/1982 |
| DE | 30 46 431 | 9/1982 |
| EP | 0 255 596 | 2/1988 |
| EP | 0 292 266 A2 | 11/1988 |
| EP | 0 470 584 A2 | 2/1992 |
| EP | 0 885 803 A2 | 12/1998 |
| GB | 1 440 081 | 6/1976 |
| GB | 1 463 969 | 2/1977 |
| GB | 2 041 028 A | 9/1980 |
| JP | 63-267525 A | 11/1988 |
| JP | 1-210318 A | 8/1989 |
| WO | WO 80/02850 | 12/1980 |
| WO | WO 00/41523 | 7/2000 |
| WO | WO 01/21383 A1 | 3/2001 |
| WO | WO 01/21399 A1 | 3/2001 |
| WO | WO 01/21877 A1 | 3/2001 |

* cited by examiner

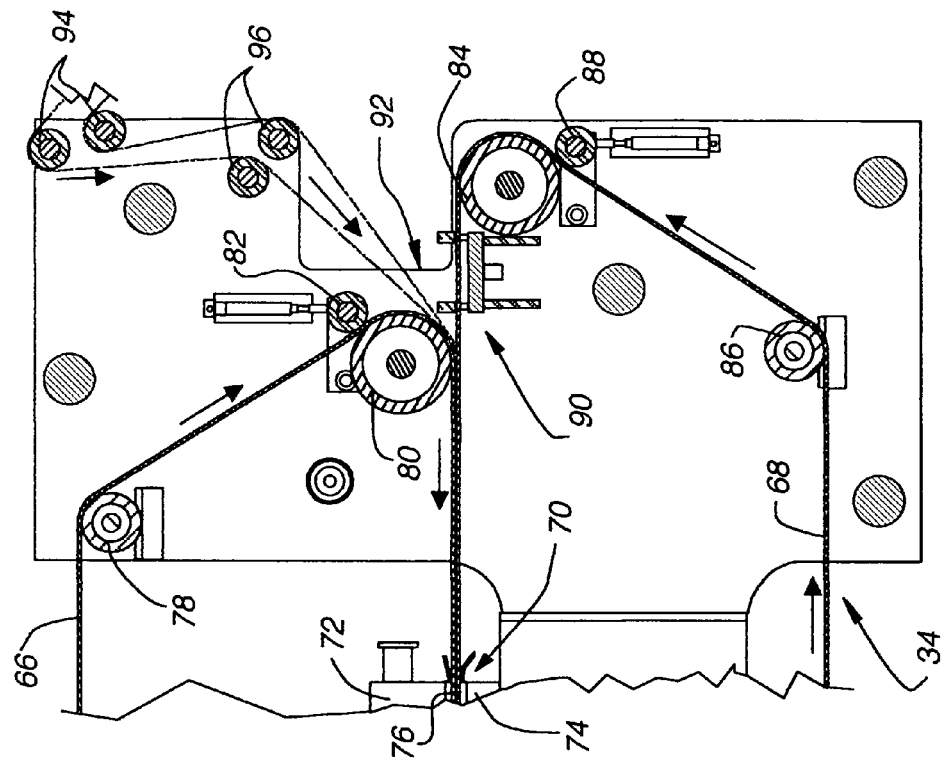
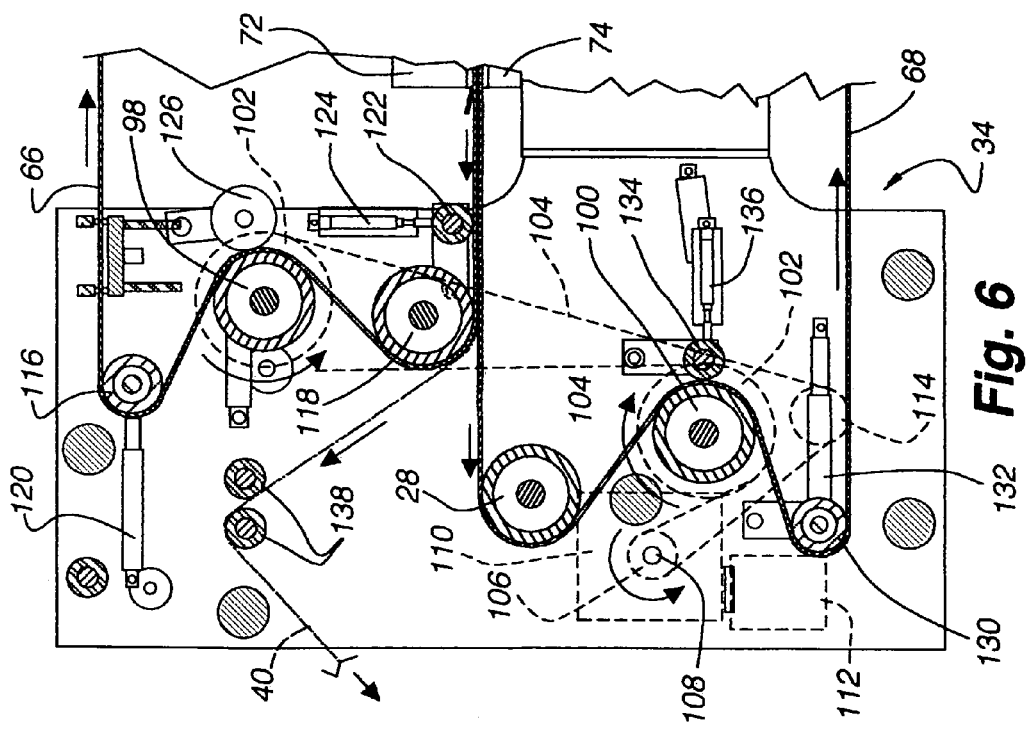

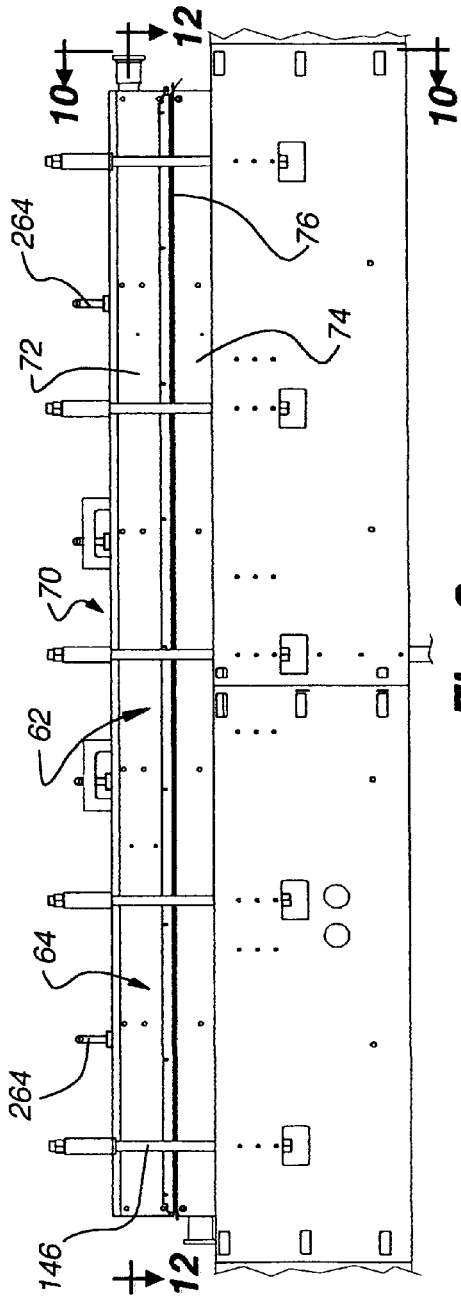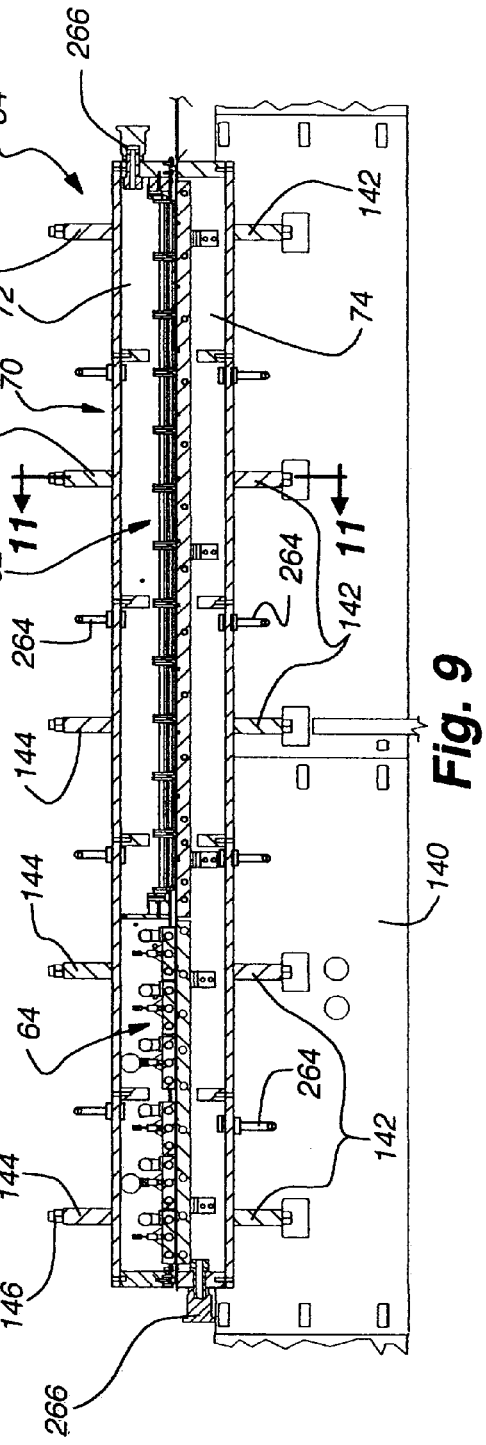

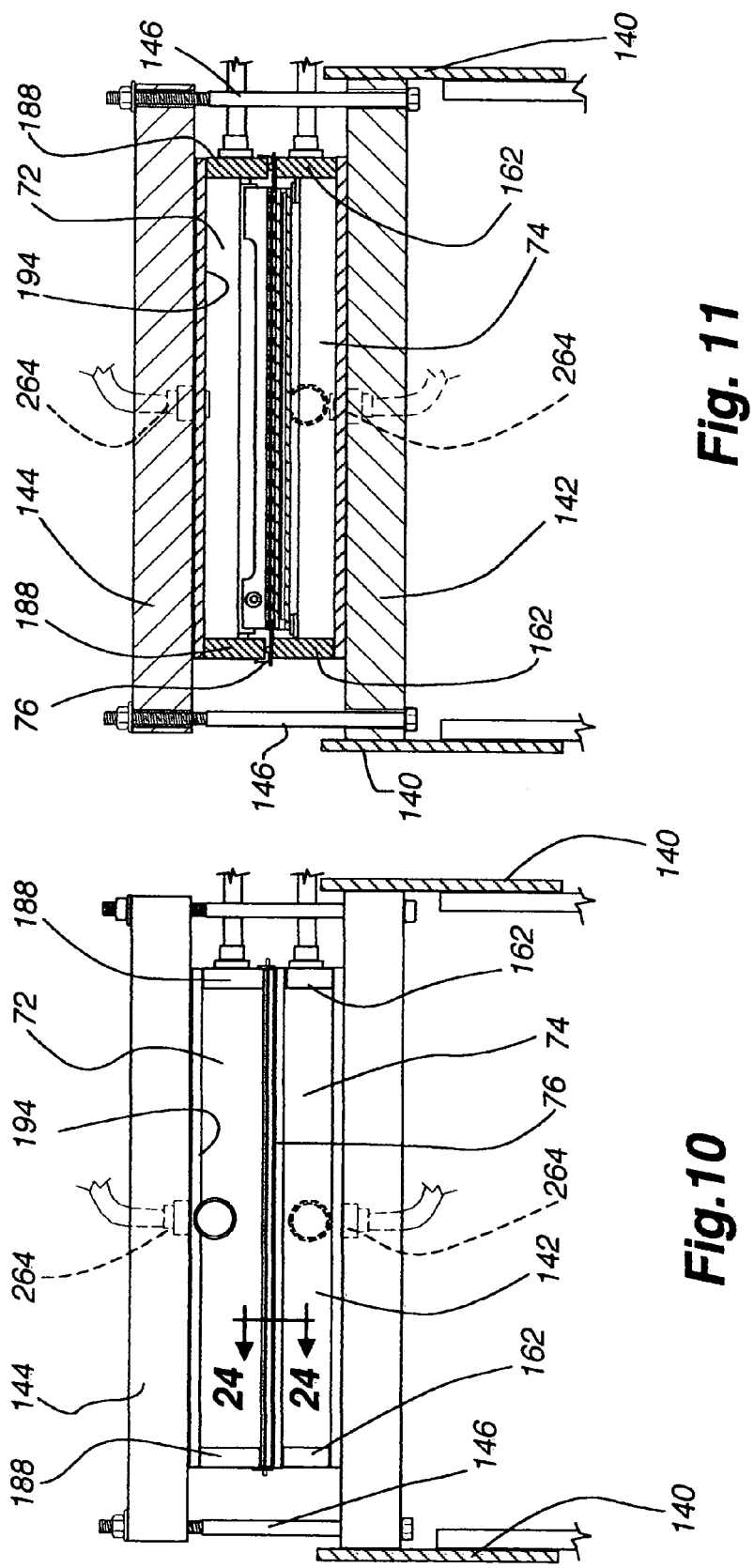

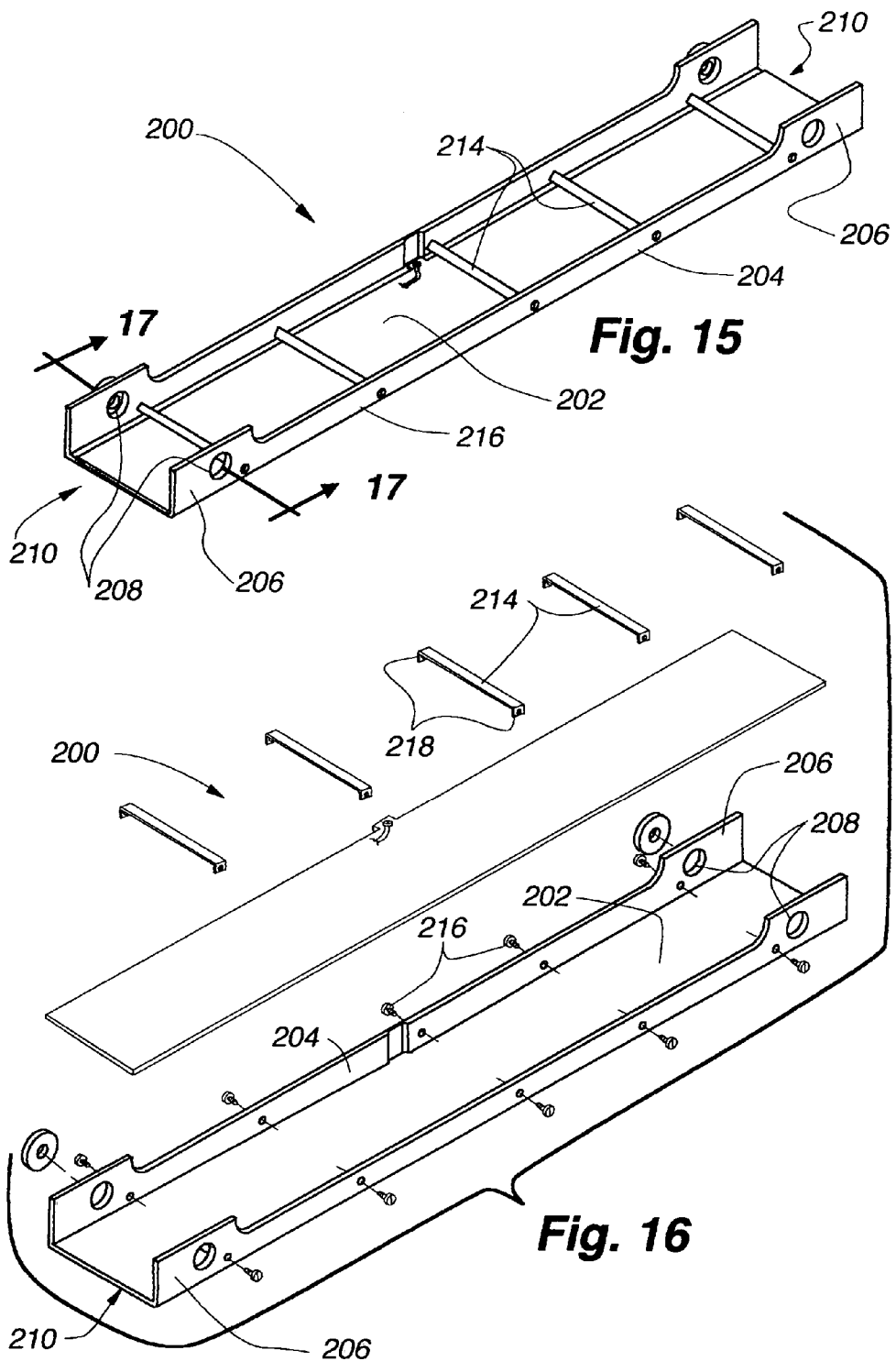

PRESSURE LAMINATOR APPARATUS

CROSS REFERENCE TO RELATED APPLICATIONS

This application is a continuation-in-part of U.S. application Ser. No. 10/088,576 for Pressure Laminator Apparatus and Non-Woven Fabric Formed Thereby filed Jul. 1, 2002 U.S. Pat. No. 6,805,771, which application is the Section 371(c) filing of International Application No. PCT/US00/25680, filed Sep. 20, 2000, which claims priority under 35 U.S.C. ¶119 from commonly owned provisional application, U.S. Ser. No. 60/155,364, filed Sep. 20, 1999, the disclosures of which are hereby incorporated by reference.

FIELD OF THE INVENTION

This invention relates to a lamination apparatus and in particular to a dual belt driven, continuous pressure lamination apparatus that utilizes pressure, heat, and cooling to bond at least two substrates (plies) with an adhesive layer between the layers of the substrates. The laminator of the present invention overcomes many of the disadvantages of prior laminators including shrinkage of materials and the like.

SUMMARY OF THE INVENTION

The laminator of the present invention can be employed to make a variety of composite and/or reinforced materials. One or more of the component parts of the laminate (i.e. the substrates or plies) may be a woven fabric material, a non-woven fabric web or a mat of fibers. Adhesive materials, preferably thermal plastic materials, are used to bond the various substrates in the laminate construction. These materials may be melted and re-melted over and over. When used to laminate yarns, especially polymer yarns, thermal plastic co-polyester adhesives are preferred, as these materials may be selected to have a melting temperature below the melting temperature of the yarns. Industrial type laminates that may be formed using the laminator of the present invention include natural and/or synthetic fabric based, asbestos based, glass based, nylon based, flame retardant and/or flame resistant based and mixtures thereof. Laminates of other materials may also be prepared as would be appreciated by those having ordinary skill in the field.

Non-woven fabrics are one especially preferred class of materials used as the plies or substrates in the pressure laminator of the present invention. Non-woven fabrics are similar to woven and knitted fabrics in that all are planar, inherently flexible, porous structures composed of natural or synthetic fiber material (i.e., yarns, threads or filaments). Non-woven fabrics are unique in that they can be engineered to resemble woven or knitted fabrics, but they can also be made to have superior physical characteristics over woven or knitted fabrics. Thus, non-woven fabrics are highly influenced by the properties of their constituent fibers and the manner in which the non-woven fabric is prepared. Typical methods for preparing non-woven fabrics include mechanical, chemical and thermal interlocking of layers or networks of the fiber materials.

In preferred embodiments of the present invention, the substrates are at least two non-woven fabric substrates, one of the fabric substrates representing the weft strands and the other representing the warp strands. Adhesive used to bond the non-woven substrates should be activated by heat during the lamination process. The combination of pressure, heating to activate the adhesive and rapid cooling of the joint substrates minimizes shrinkage and sets the yarn size in the final non-woven fabric laminate. In addition, because the laminate is being formed under pressure, the warp and weft yarns are forced into intimate contact, giving the final laminate the appearance of a woven product.

The lamination apparatus of the present invention has an outer housing or frame in which a rectangular pressure box is mounted. The shape of the box need not be rectangular, but that shape is currently preferred. The pressure box comprises two spaced apart sections, an upper section and a lower section, each of which has pressure seals along its four edges and each of which is further provided with a plurality of both heating and cooling elements. Two counter rotating drive belts, an upper drive belt and a lower drive belt, contact one another at and together run through a space between the two sections of the pressure box. The belts are dimensionally larger (length and width) than the pressure box. One belt is driven in a clockwise manner and the other belt is driven in a counterclockwise manner. Once the belts are in motion, one end of the pressure box is the inlet (feed) end and one end is the outlet (exit) end of the laminator.

The lower section of the pressure box is mounted rigidly to the frame or housing, whereas the upper section of the pressure box can be adjusted as necessary to permit access to the interior of the box. Normally, the sections are spaced apart sufficiently to permit passage of the drive belts therebetween under pressure or in a depressurized state, with or without material to be laminated therebetween.

During the lamination process, substrate materials to be laminated are passed through a pressure seal at the inlet end of the pressure box, and into the space between the two drive belts. Air pressure applied to the upper and lower sections of the pressure box is used to compress the air impermeable belts toward one another, creating a diaphragm effect between the belts, thereby compressing the substrates situated therebetween. The upper and lower sections of the pressure box are equipped with heating and cooling elements, which are used to activate and set the thermal plastic adhesive between the substrate layers.

Movement of the two belts through the pressure box allows for the continuous feeding of substrate materials and thermal plastic adhesive entering the laminator through the inlet pressure seal. Once therein, the substrates are nipped or pressed together by the diaphragm effect caused by the pressure applied to the belts in opposite directions. The pressed substrates are then heated under pressure, melting the thermal plastic adhesive. This allows the substrate layers to come closer together, with at least some portions of the warp and weft yarn strands becoming coplanar or nearly coplanar. The heated substrates are then cooled, while still under pressure, forming the final laminate. The cooled laminate exits the pressure box through an exit pressure seal where it is collected as desired.

In the present invention, the use of the fluid pressure medium, for e.g., air (or other gas such as steam), or liquid, (e.g., water, oil, etc.), allows the belts to move, even though being pressured from both the top and the bottom. The belts of the present laminator slide through, even though they encounter forces that might break a belt in a conventional laminator.

While designed for a specific purpose, the pressure laminator of the present invention can have other uses, for example, printed circuit board substrate manufacture, decorative laminating, industrial laminating, and the like, as will be appreciated by those having ordinary skill in this art.

Other aspects, features, and details of the present invention can be more completely understood by reference to the following detailed description of a preferred embodiment, taken in conjunction with the drawings and from the appended claims.

BRIEF DESCRIPTION OF THE DRAWINGS

FIG. 6 is an enlarged fragmentary section taken along line 6—6 of FIG. 2.

FIG. 7 is an enlarged fragmentary section taken along line 7—7 of FIG. 2.

FIG. 8 is an enlarged view taken along line 8—8 of FIG. 2.

FIG. 9 is an enlarged fragmentary section taken along line 9—9 of FIG. 2.

FIG. 10 is a fragmentary section taken along line 10—10 of FIG. 8.

FIG. 11 is an enlarged fragmentary section taken along line 11—11 of FIG. 9.

FIG. 15 is an isometric of an upper heating element used in the laminator of the invention.

FIG. 16 is an exploded isometric similar to FIG. 15.

DESCRIPTION OF THE PREFERRED EMBODIMENT

Figure 1:
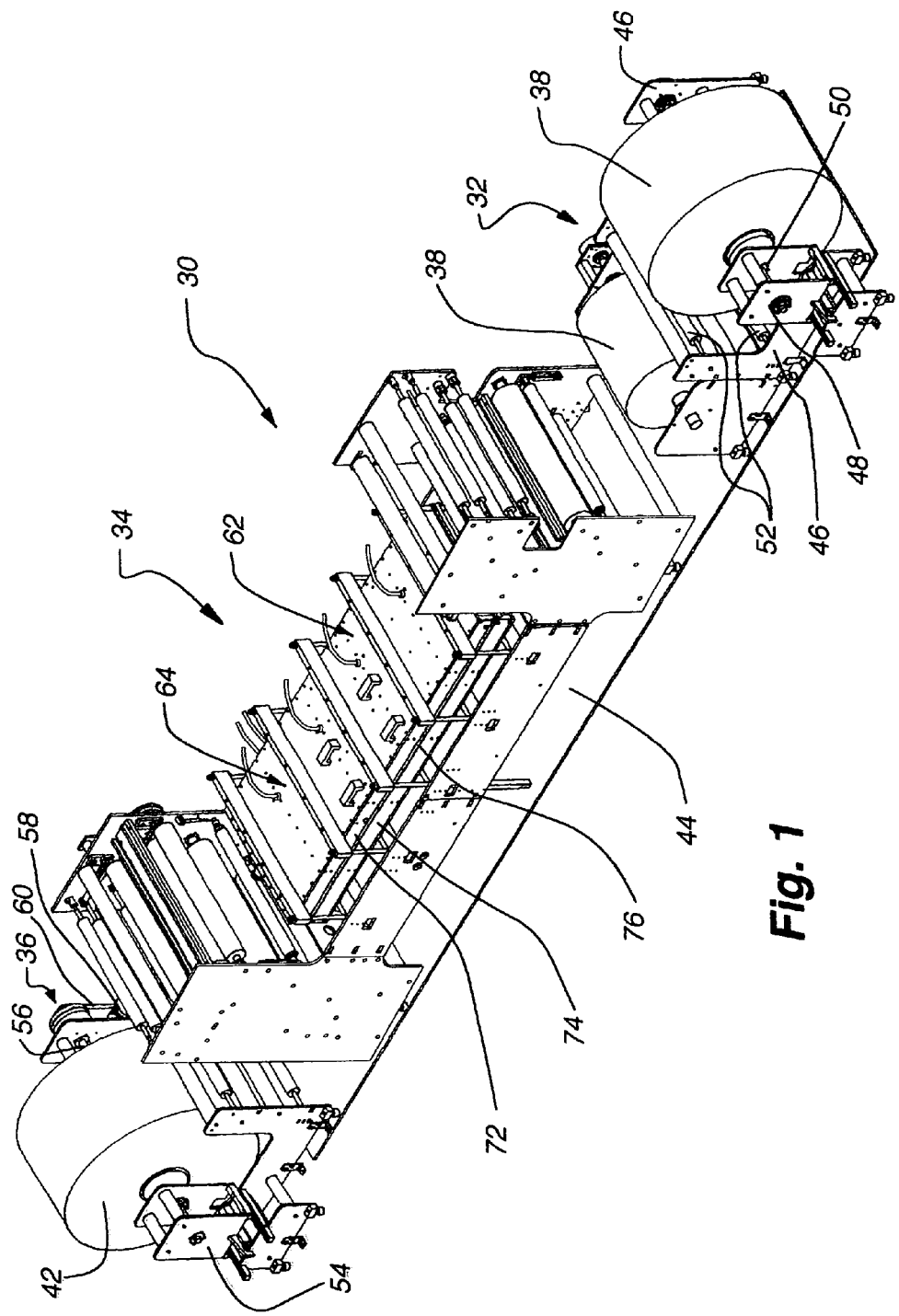
FIG. 1 is an isometric view of the laminator of the present invention.
Figure 2:
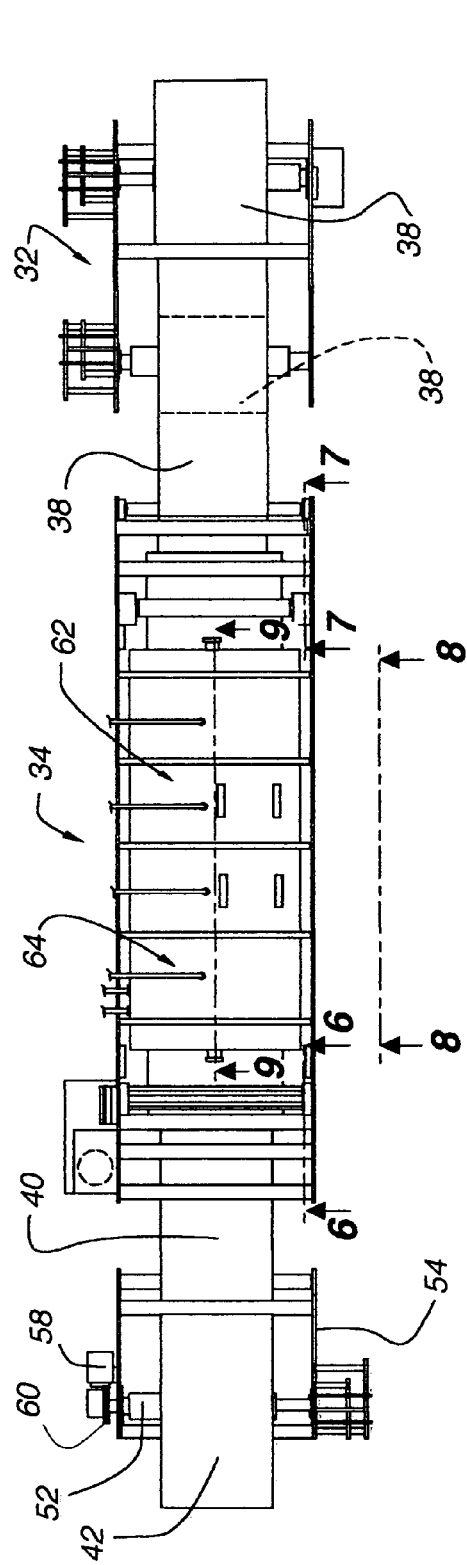
FIG. 2 is a top plan view of the laminator of FIG. 1.
Figure 3:
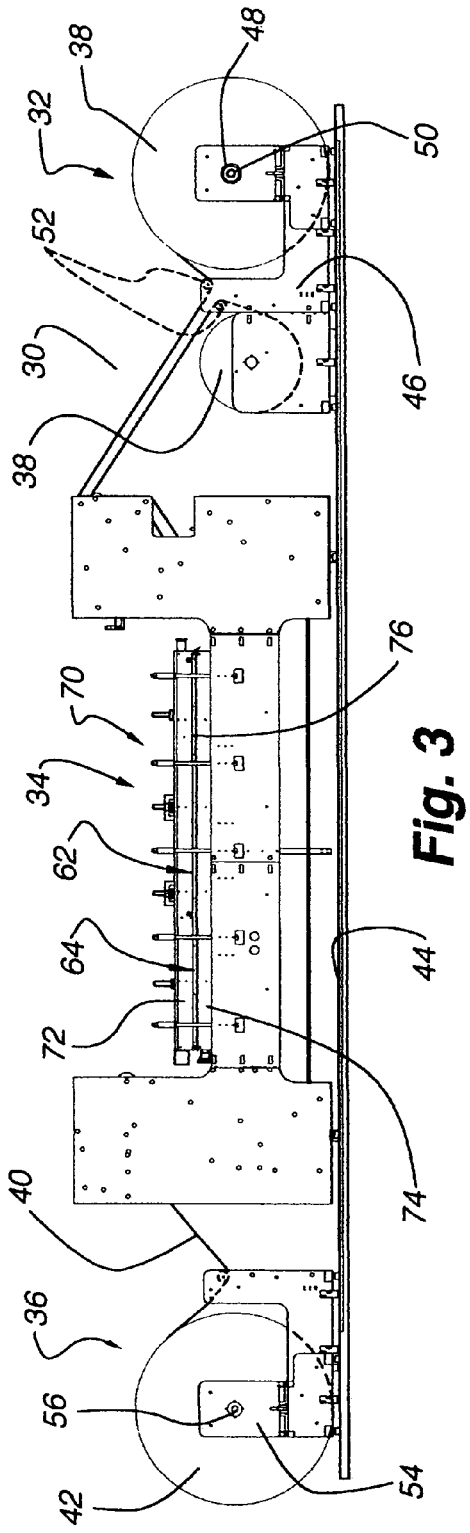
FIG. 3 is a side elevation of the laminator of FIG. 1.

The apparatus 30 of the present invention is probably best appreciated in FIGS. 1–5 as an elongated inline apparatus for taking supply rolls of sheet-like material defining substrates or plies and laminating the materials together so as to thereafter wrap the resultant laminate on a take-up roll. The apparatus 30 can be seen to include a supply station 32, a laminating station 34, and a take-up station 36. While the supply station illustrates only two supply rolls of sheet material 38, it should be understood from the following description that any reasonable number of supply rolls of sheet-like material could be assembled in the supply station and fed to the laminating station in a manner well within the knowledge of those skilled in the art. One of the supply rolls of sheet material 38 as described herein is presumed to include a heat-activated adhesive (not seen) pre-applied thereto which is utilized to bond the two sheet materials together in the laminating station 34 of the apparatus. The two sheets of material could be by way of example, a sheet or web of warp fibers and a sheet or web of weft fibers with one or the other sheet having a layer of the heat-activated adhesive thereon.

Accordingly, the laminate 40 formed in the apparatus 30 and recovered on a take-up roll 42, would be a heat-pressed non-woven laminate that resembled a woven fabric with bonded warp and weft fibers. Another alternative to the supply of material for lamination in the apparatus would reside in the provision of a separate roll of an adhesive scrim (not shown) which could be utilized if one of the sheets of supply material did not have adhesive already pre-applied thereto. Accordingly, while the variations of supply materials are numerous, to facilitate an understanding of the present invention, there are only two supply rolls of sheet material with one of the materials having a heat-activated adhesive thereon.

The supply station 32, laminating station 34, and take-up station 36 can all be mounted on a single sheet 44 of structural support material inasmuch as the system is an inline and self-contained laminating system.

The supply station 32 includes upstanding side walls 46 extending lengthwise of the apparatus with the side walls supporting bearings 48 and horizontal idler shafts 50 on which rolls of the supply material are removably mounted. Brake systems (not seen) are also associated with the idler shafts to selectively adjust the resistivity to rotation of the rolls in the direction of feed of the sheet material to the laminating station 34 for a reason to become evident later. Further, idler rollers 52 are provided to guide the sheet material to predetermined locations at the inlet end of the laminating station 34 as will be more evident with the detailed description hereafter. The take-up station 36 is constructed with vertical side walls 54 which support a horizontal driven shaft 56 on which the removable take-up roll 42 for the laminate is disposed. The take-up roll is rotatably driven by a motor 58 and belt drive 60 at a predetermined speed commensurate with the speed at which the lamination process is to take place. The take-up roll literally pulls the supply sheets of material 38 through the laminating station 34 against the resistance of the brakes on the supply rolls.

Figure 4:
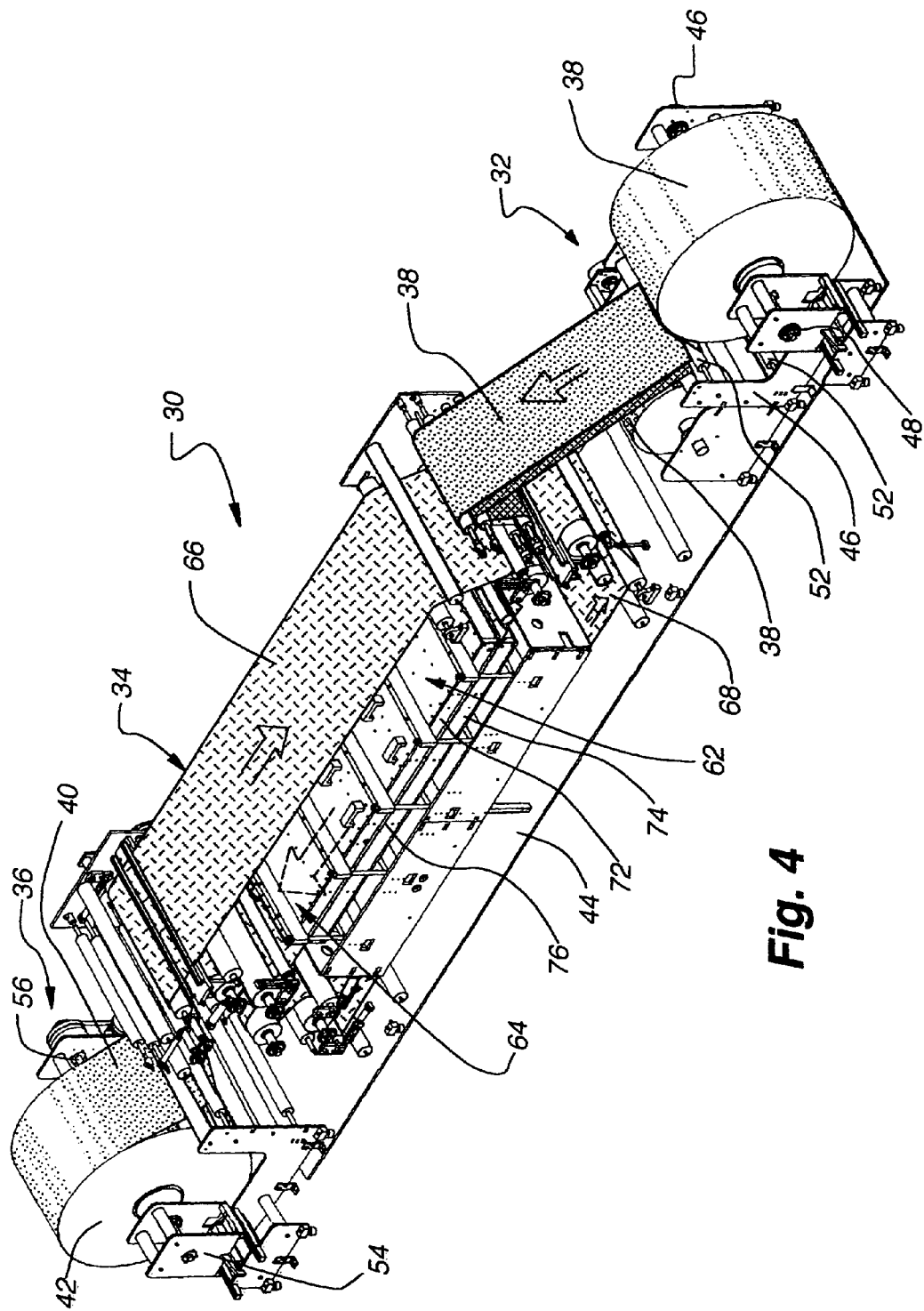
FIG. 4 is an isometric view similar to FIG. 1 with side panels removed and with materials being processed in the laminator.
Figure 5:
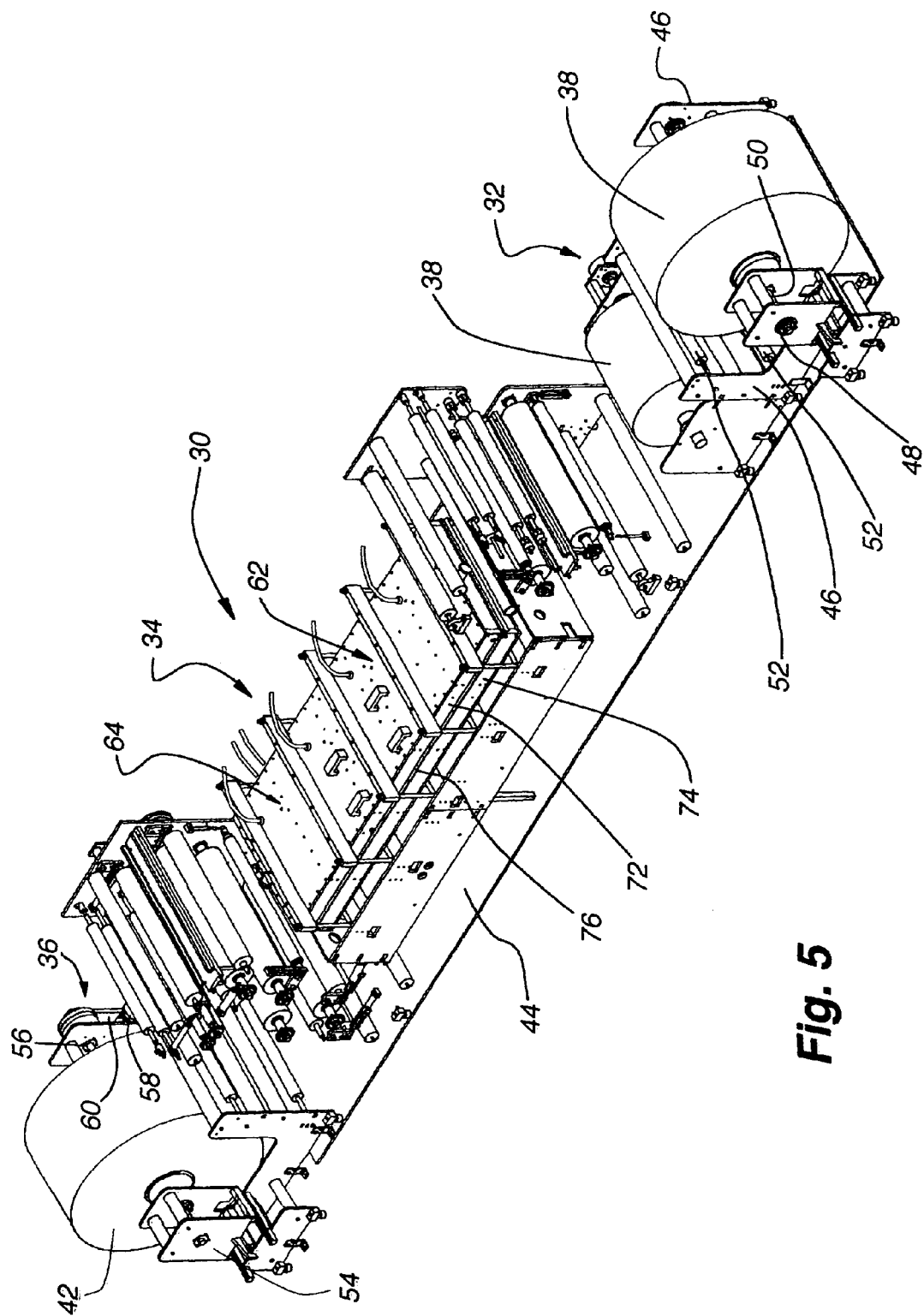
FIG. 5 is an isometric similar to FIG. 4 with portions of the processed materials having being removed.

With particular reference to FIG. 4, the two sheets of material 38 or substrates from which the laminate is to be made are shown emanating from the supply station 32 of the apparatus where they subsequently pass through a plurality of alignment and tensioning rollers to be described in more detail hereafter. The sheets are then subsequently fed in overlying face-to-face relationship through a heating chamber or section 62 of the laminating station 34 and subsequently a cooling chamber or section 64 so that the adhesive on one of the supply rolls of material can be activated in the heating chamber and subsequently cooled and set in the cooling chamber before the resulting laminate 40 is passed around a plurality of tensioning and guide rollers at the downstream end of the laminating station and fed onto the take-up roll 42 for storage. As the supply sheet material is being heated and cooled, it is also compressed between upper and lower counter-rotating endless drive belts 66 and 68, respectively, which have a common horizontal run in which they are moving in the same downstream direction through the laminating station above and below the supply sheets of material 38. The drive belts in the horizontal run divide a pressure box 70 in the laminating station into upper and lower sections 72 and 74, respectively, with the upper and lower sections being correspondingly pressurized to force the upper and lower belts in opposite directions toward each other during the horizontal run to compress the sheets of supply material disposed therebetween. Of course, the belts are driven at a speed commensurate with that at which the take-up roll is pulling the supply sheet material through the laminating station so there is no slippage between the belts and the supply sheets of material.

As will be described in more detail hereafter, the heating chamber 62 includes heaters in the upper and lower sections of the pressure box 70 so the supply rolls of material are heated from above and below. Similarly, the cooling chamber 64 of the laminating station has coolers in the upper and lower sections of the pressure box so the adhesive is set with cool temperatures from both above and below the laminate material passing therethrough. As will also be described in more detail later, the upper and lower counter-rotating drive belts are at least as wide as the pressure box and the pressure box has sliding hermetic seals 76 around the peripheral confronting faces of the upper and lower sections 72 and 74 which slidingly interact with the drive belts to establish the pneumatically sealed upper and lower section of the pressure box 70 above and below the supply materials 38.

With reference to FIGS. 6 and 7, the downstream (exit) and upstream (inlet) ends of the laminating station 34 are illustrated. Looking first at FIG. 7 showing the upstream end of the laminating station, it will be seen that the upper drive belt 66 passes around upper 78 and lower 80 idler rollers with a nip or pressure roller 82 at the location where the drive belt first engages the lower idler roller 80. The lower edge of the lower idler roller is substantially coplanar with the lower edge of the upper section 72 of the pressure box 70 so the upper drive belt passes along the lower edge of the upper section of the pressure box. Similarly, the upstream end of the lower drive belt has an upper 84 and a lower idler 86 roller and a nip roller 88 aligned with the upper idler roller 86 at the location where the lower drive belt 68 first engages the upper idler roller. The lower drive belt can be seen to extend further upstream than the upper drive belt 66 and, accordingly, the upper run of the lower drive belt passes through a guide 90 before passing downstream beneath the upper drive belt so that the drive belts are desirably aligned. The longitudinal side edges of both the upper and lower drive belts are accordingly aligned and, as will be described in more detail later, extend along the outer side edges of the pressure box 70 in sliding engagement with the seal 76 along each side of the pressure box to hermetically seal the upper section 72 of the pressure box from the lower section 74. The belts 66, 68 are made of an air impermeable material as will be described later.

At the location where the lower idler roller 80 at the upstream end of the upper drive belt 66 is positioned above the lower drive belt 68, a feed gap 92 is established between the two belts into which the two supply sheets of material 38 can be fed. Each sheet of supply sheet material also passes around an upper 94 and lower 96 idler roller to desirably position the sheet material for being fed into the feed gap between the upper and lower drive belts. As will be appreciated, at the point where the upper drive belt leaves the lower idler roller 80, the lower run of the upper drive belt 66 and the upper run of the lower drive belt 68 are in face-to-face and engaging relationship. The belts, of course, are traveling downstream along their engagement and carry the supply sheets of material 38 therebetween until they reach the downstream end of the laminating station 34.

At the downstream end of the laminating station as seen in FIG. 6, an upper 98 and lower 100 drive roller are each provided with a sprocket 102 around which a drive chain 104 passes and is operatively engaged to simultaneously rotate the drive rollers at a predetermined speed. The drive chain is driven by a drive sprocket 106 on an output shaft 108 of a transmission 110 which is driven by a motor 112 at the downstream end of the laminating station 34. The drive chain passes around a guide sprocket 114 at the bottom of the laminating station and is operatively engaged with the drive roller 98 for the upper belt 66 to rotate it counterclockwise and the drive roller 100 for the lower drive belt 68 to rotate it clockwise. The upper drive belt also passes around an upper 116 and lower 118 idler roller at the downstream end of the laminating station with the upper idler roller 116 being a tensioning idler roller while being mounted on a pneumatic tensioner 120. A further compression roller 122 is mounted on a pneumatic pressure cylinder 124 for engagement with the inner surface of the upper drive belt 66 while it is still superimposed on the lower drive belt 68. A nip roller 126 engages the drive roller 98 with the drive belt 66 therebetween to maintain positive engagement of the drive belt with the drive roller.

The lower drive belt 68 in addition to passing around its associated drive roller 100 further passes around upper 128 and lower 130 idler rollers with the lower idler roller being mounted on a tensioning cylinder 132 to maintain a desired tension in the drive belt. A pressure idler roller 134 also engages the drive roller 100 with the lower drive belt therebetween with the pressure roller 134 being mounted on a pressure cylinder 136 to maintain desired friction between the lower drive belt 68 and its drive roller 100.

It will therefore be appreciated that each of the upper 66 and lower 68 drive belts is driven at a synchronized rate which is also commensurate with the rate at which the take-up roll 42 pulls the supply material 38 through the laminating station 34. The laminate 40 resulting from the lamination process exits the laminating station after passing by the lower idler roller 118 for the upper drive belt and subsequently passes between a pair of idler guide rollers 138 before passing to the take-up roll at the take-up station.

Figure 13:
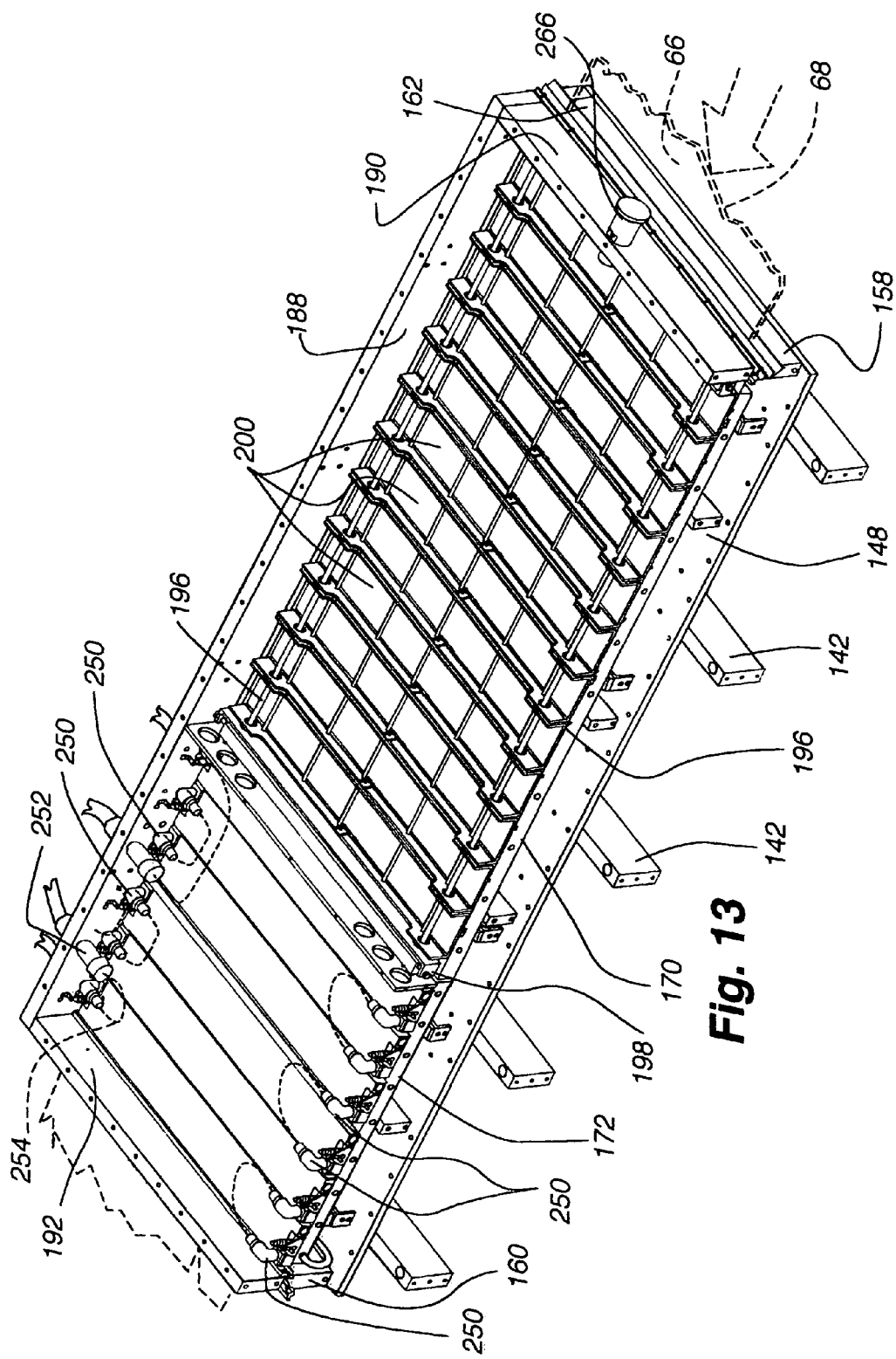
FIG. 13 is a fragmentary isometric section looking at the portion of the laminator shown in FIG. 12.

As probably best seen in FIGS. 9, 10, and 13, the laminating station 34 includes a housing having side panels 140 which are interconnected with and support a lower set of transverse beams 142 which are spaced longitudinally of the laminating station. An upper set of transverse beams 144 are vertically aligned with the lower set of transverse beams and are connected thereto by vertical adjustment rods 146 at each end of the upper and lower sets of transverse beams. The adjustment rods as probably best seen in FIG. 11 are utilized to adjust and fix the vertical spacing between the upper and lower sets of transverse beams. The upper and lower sets of transverse beams define a gap therebetween in which the pressure box 70 is positioned and it will therefore be evident that by reducing the spacing between the upper and lower transverse beams with the adjustment rods 146, the upper and lower sections 72, 74 of the pressure box can be selectively moved toward each other.

As possibly best appreciated by reference to FIG. 13, the lower pressure box section 74 has a lower base plate 148 connected and sealed to an upstanding inlet wall 158, an outlet wall 160 and opposite side walls 162. In FIG. 13, the side wall 162 closest to the viewer has been removed for clarity purposes.

Figure 23:
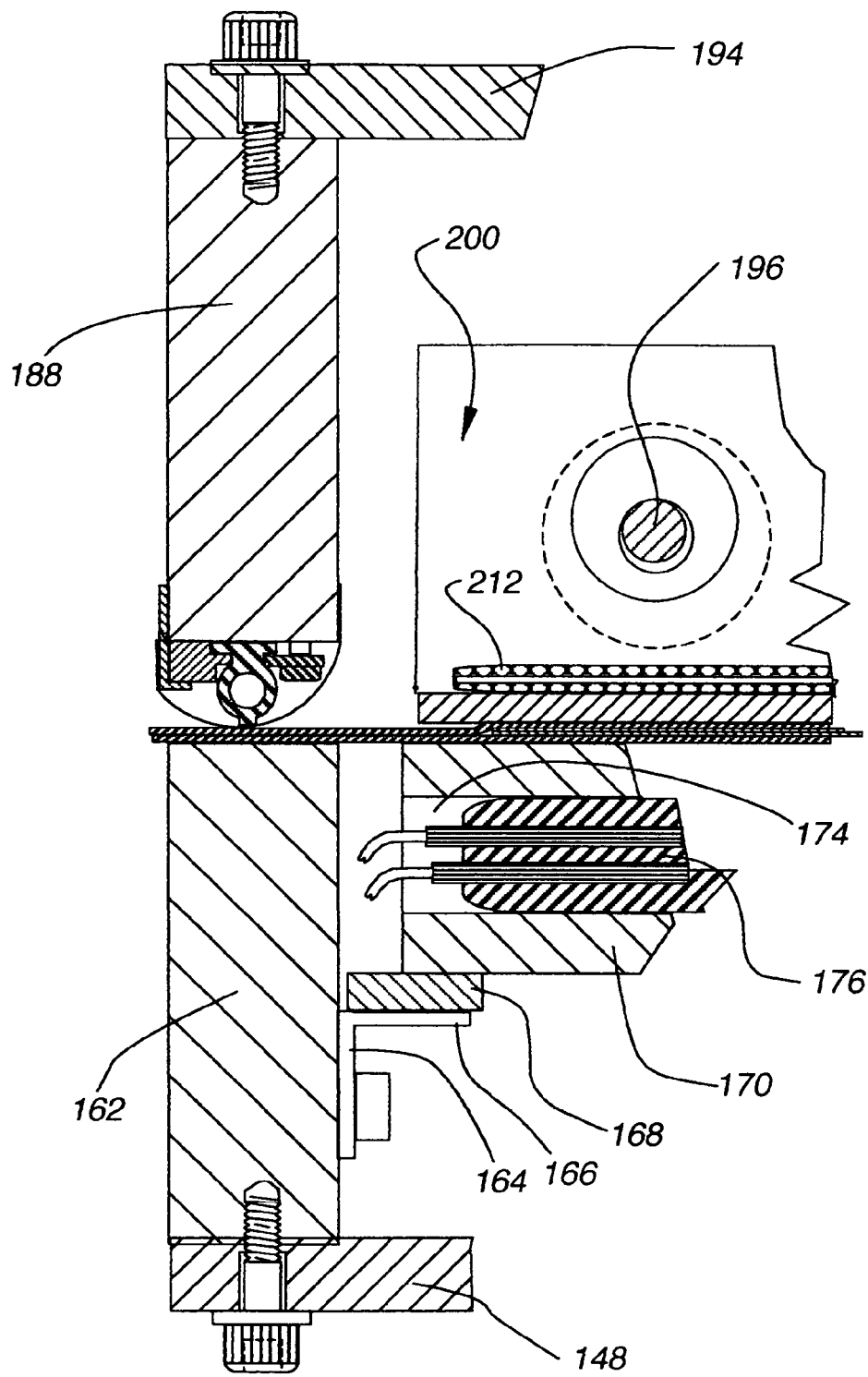
FIG. 23 is an enlarged fragmentary section taken along line 23—23 of FIG. 12.

As best seen in FIG. 23, each side wall 162 includes a support L-bracket 164 that is secured thereto and has a horizontal ledge 166 with a cushioning pad 168 for supporting support plates 170 or 172 that in combination effectively form an upper wall of the lower section 74 of the pressure box. The plates are not secured to the support brackets 164 but rather are seated thereon such that their upper surface defines a support surface for the horizontal run of the drive belts 66, 68. The support plate 170 is in the heating chamber 62 of the pressure box 70 and the support plate 172 in the cooling chamber 64. The support plate 170 in the heating chamber has a plurality of transversely extending holes 174 in which are provided resistance heating rods 176 which are connected to an electrical source (not shown) in any suitable manner so that the rods can be heated electrically to thereby heat the support plate. The support plate 170 is made of a metallic material such as aluminum and of course the upper horizontal run of the lower drive belt 68 extends across the top surface of the support plate and is therefore heated thereby as it passes through the laminating station 34.

Figure 19:
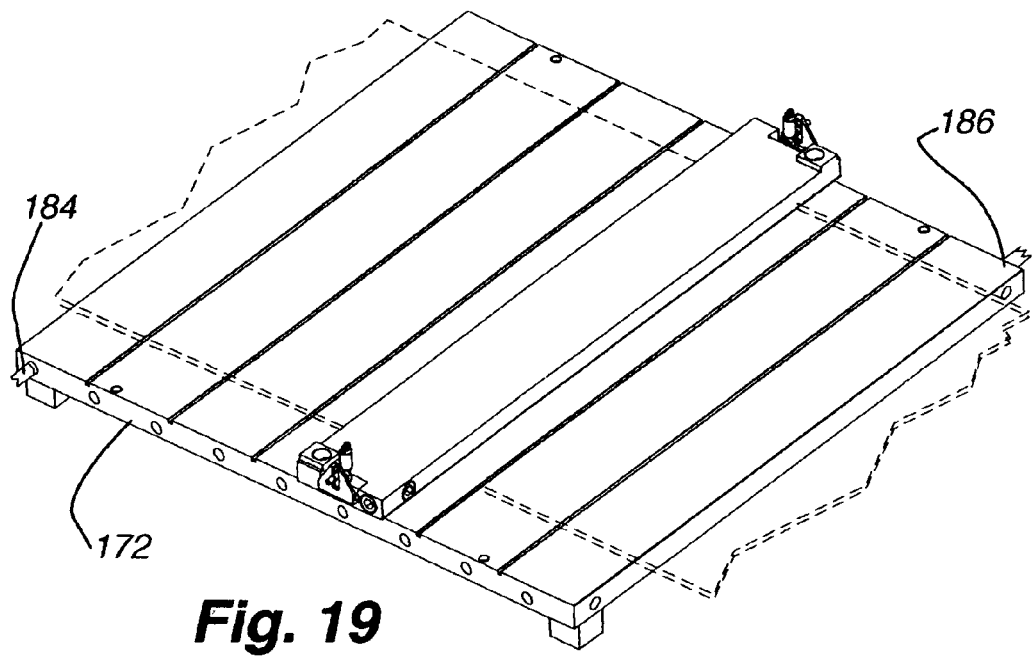
FIG. 19 is an isometric similar to FIG. 14 looking at a cooling section of the laminator with the transfer belts shown in dashed lines.
Figure 19B:
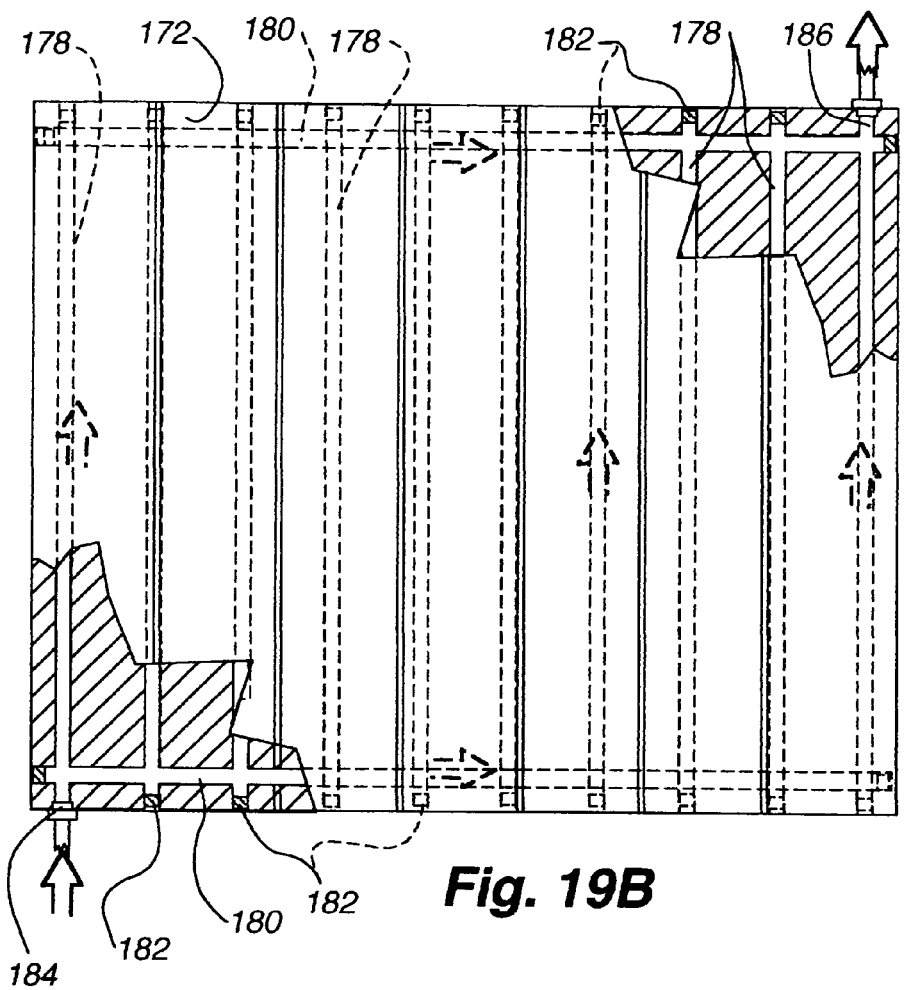
Figure 19A:
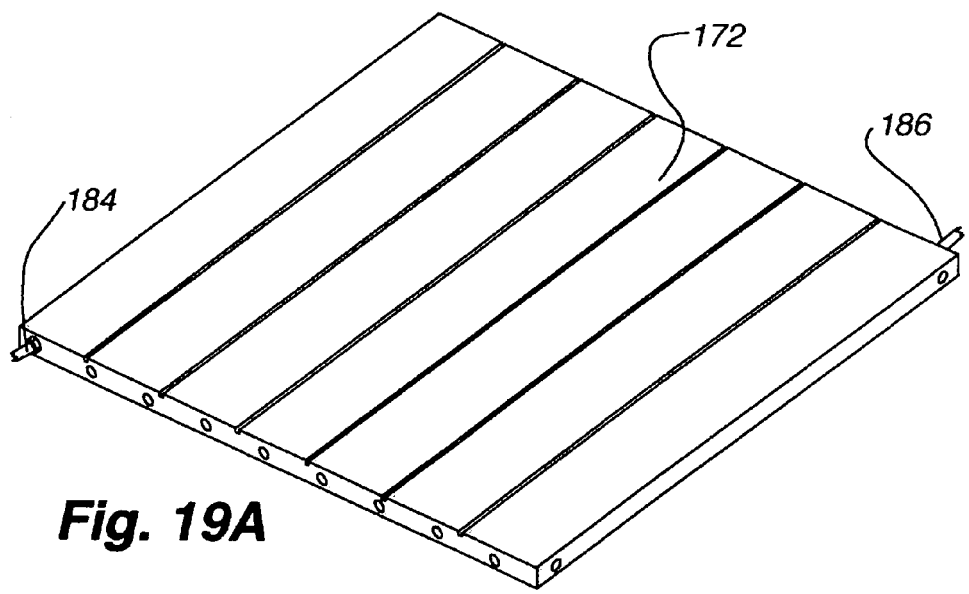

The support plate 172 (FIG. 13) in the cooling chamber 64 of the pressure box 70 also has transverse passages 178 formed therethrough with interconnecting manifold passages 180 (FIG. 19B) along opposite side edges. The transverse passages 178 are suitably plugged at their open ends 182 except for one transverse passage which has an open end or inlet 184 into which a cooling liquid such as water or Freon can enter the support plate and another transverse passage which has one open end or outlet 186 through which the cooling liquid can be removed from the support plate. Accordingly, as cooling liquid is passed into the inlet 184, it passes through the manifold 180 and transverse 178 passages and exits through the outlet 186.

From the above, it will be appreciated the lower section 74 of the pressure box is sealed along its bottom and side walls and further has a top wall in the form of the support plates 170, 172 which in combination extend substantially the full width and length of the lower section of the pressure box. The seal 76, to be described in more detail later, extends around the perimeter of the lower section 74 of the pressure box by being mounted along the top edge of the side walls 162, the inlet end wall 158, and the outlet end wall 160.

The upper section 72 of the pressure box 70 can also be seen generally in FIGS. 11 and 13 to include longitudinally extending side walls 188, an inlet end wall 190, and an outlet end wall 192 with a top plate 194 sealed to and overlying the top edges of the side and end walls as possibly best seen in FIGS. 8–11 and 23. The upper section of the pressure box is divided between the heating chamber and the cooling chamber by a transverse divider plate 194.

In the heating chamber 62 of the upper section 72 (FIGS. 13 and 23) of the pressure box, a plurality of longitudinally extending support rods 196 extend along each side of the upper pressure box at a location spaced a short distance inwardly from an associated side wall 188. The upstream end of the support rods are supported on the inlet end wall 190 of the upper section while the downstream end of the support rods are supported on a cross beam 198 that itself is secured to the side walls 188 of the upper section of the pressure box adjacent to the downstream end of the heating chamber 62. The support rods in turn loosely support a plurality of side-by-side transverse heating trays or elements 200 with the elements probably being best seen in FIGS. 15, 16, and 23.

Figure 17:
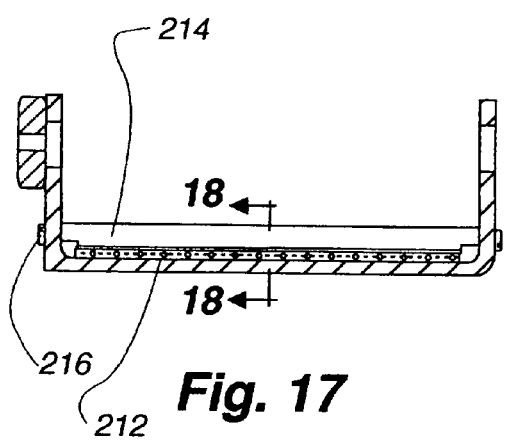
FIG. 17 is an enlarged section taken along line 17—17 of FIG. 15.
Figure 18:
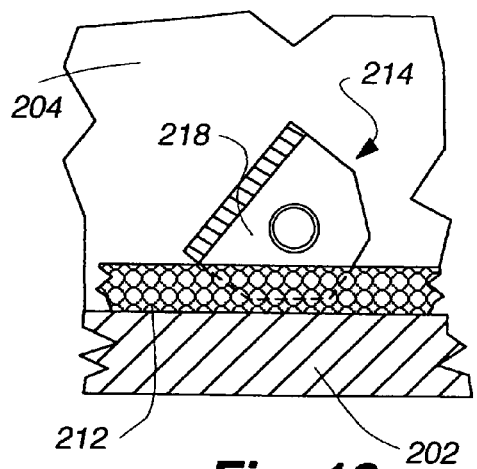
FIG. 18 is an enlarged fragmentary section taken along line 18—18 of FIG. 17.
Figure 14:
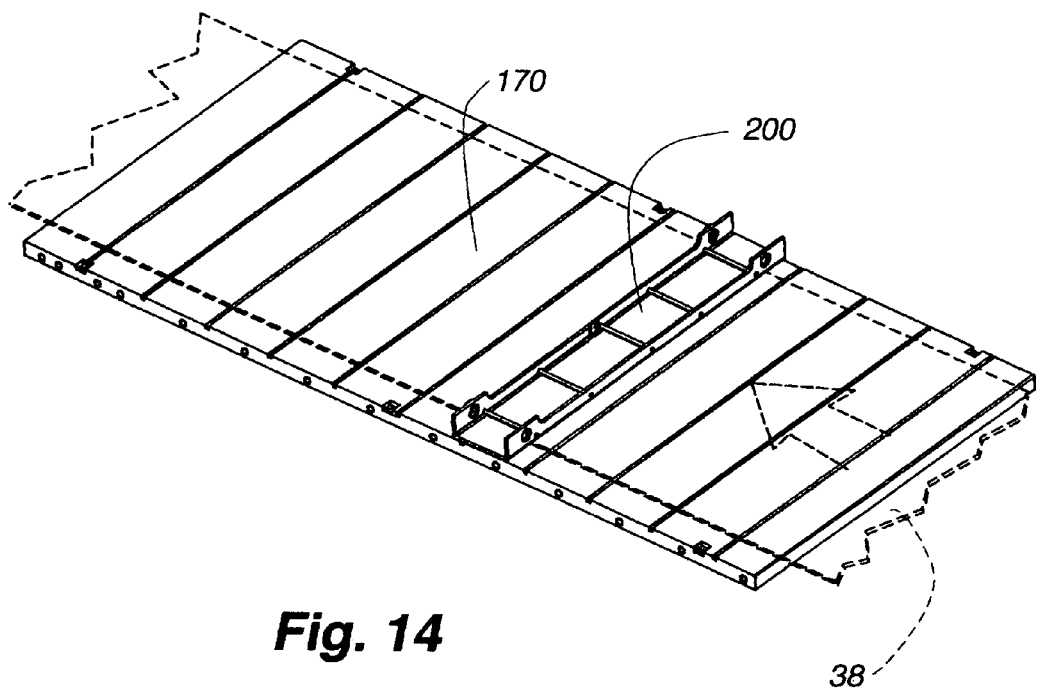
FIG. 14 is an isometric of the heating section of the laminator of the invention with transfer belts shown in dashed lines.

Each element 200 is of generally open channel-shaped configuration having a bottom wall 202, upstanding side walls 204 with enlarged tabs 206 at each end of the side walls through which a circular opening 208 is formed, and open ends 210. The circular opening 208 as best seen in FIG. 23 is of slightly larger diameter than that of the support rods 196 which are received in the openings so the channel-shaped members are free to float up and down on the associated support rods. A resistance heating pad 212 is positioned in the channel in overlying and supported relationship with the bottom wall 202 of the channel and the heating pad is held in position by a plurality of clamp bars 214 which are pivotally mounted on the side walls 204 of each channel member by fasteners 216 as seen in FIGS. 16, 17 and 18. The fasteners allow the clamp bars to pivot about a longitudinal axis transverse to the channel member. The clamp bars are of generally inverted U-shaped longitudinal cross section so as to have downturned end tabs 218 which rotatably receive the fasteners 216. The heating pad is of a width to fit between the end tabs 218 and the heating pad can be clamped into tight abutting relationship with the bottom wall 202 of an associated channel member by rotating the clamp bars as shown in FIG. 18 until the longitudinal body of the clamp bar engages the top surface of the heating pad. The clamps can then be tightened with the fasteners to retain the clamped position and secure the heating pad in its associated channel member.

As probably best appreciated by reference to FIG. 13, a plurality of the channel members 200 are mounted in the heating chamber 62 of the upper section 72 of the pressure box in contiguous side-by-side relationship and rest on the upper drive belt 66 that is passing therebeneath. Accordingly, the weight of each channel member, which is not great as the channel members are preferably made of an aluminum material, is supported on the inner surface of the upper drive belt. The heating elements 200 are allowed to float, however, so as to accommodate the increased thickness of material passing through the laminating station when the supply material 38 is positioned therein. The heating pads 212 are connected to an electrical source (not shown) in any suitable manner so they are uniformly heated to a desired temperature.

It will be appreciated from the above that the heating chamber 62 of the pressure box has heaters in the form of the plurality of channel elements 200 on top of the drive belts in the upper section 72 of the pressure box and the heating plate 170 beneath the drive belts in the lower section 74 of the pressure box.

In the cooling chamber 64 of the upper section 72 of the pressure box, a plurality of side-by-side cooling bars 220 or elements (FIGS. 12, 20 and 21) extend transversely of the pressure box 70 and are mounted in contiguous side-by-side relationship and again in a floating manner so the weight of the cooling bars is applied downwardly toward the upper drive belt 66 which is immediately therebeneath. The cooling elements are probably best seen in FIGS. 13 and 19–22. Each cooling element is seen to include a bar 222 provided with three longitudinally extending passages 224 which extend, therefore, from side to side of the pressure box. The passages 224 are interconnected in a manner to be described hereafter so that a cooling fluid such as water or Freon can be passed successively through the cooling bars and ultimately removed therefrom to transfer heat from the cooling chamber.

Figure 22:
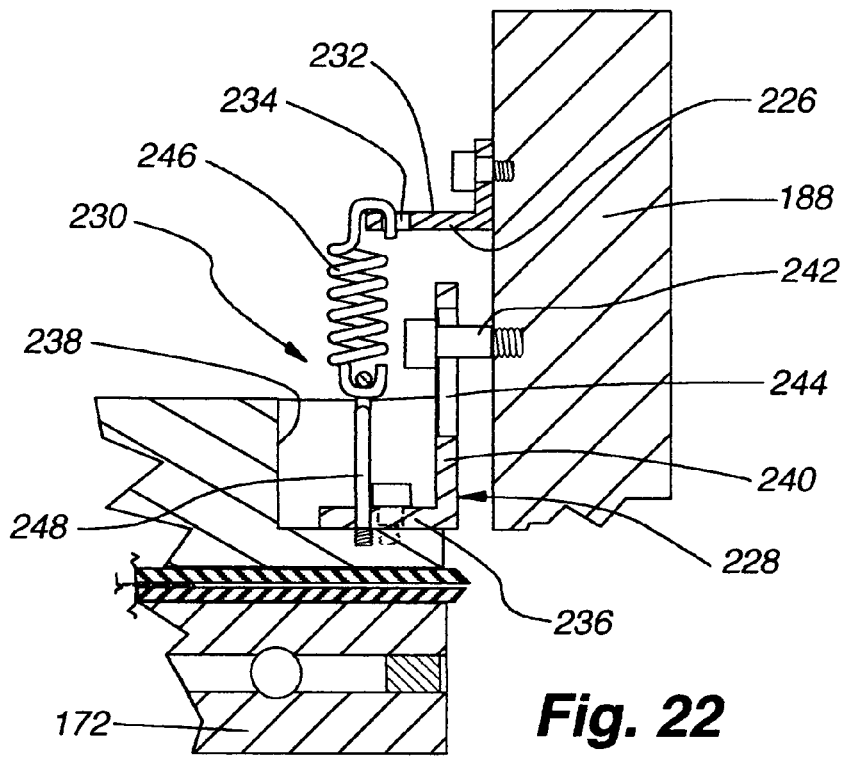
FIG. 22 is an enlarged fragmentary section taken along line 22—22 of FIG. 21.
Figure 20:
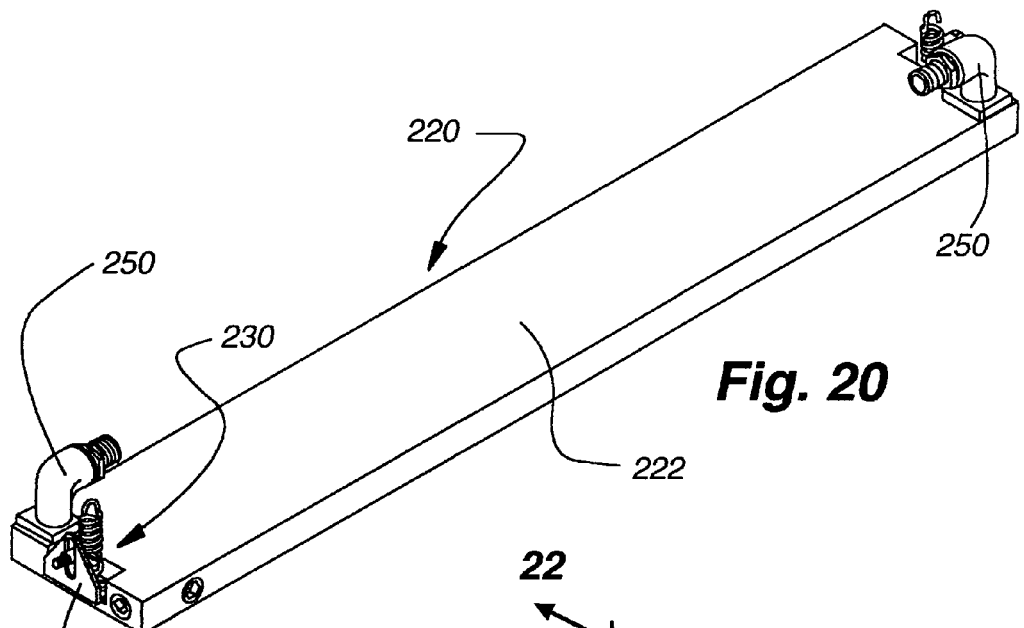
FIG. 20 is an isometric of a cooling element used in the upper section of the laminator of the invention.
Figure 21:
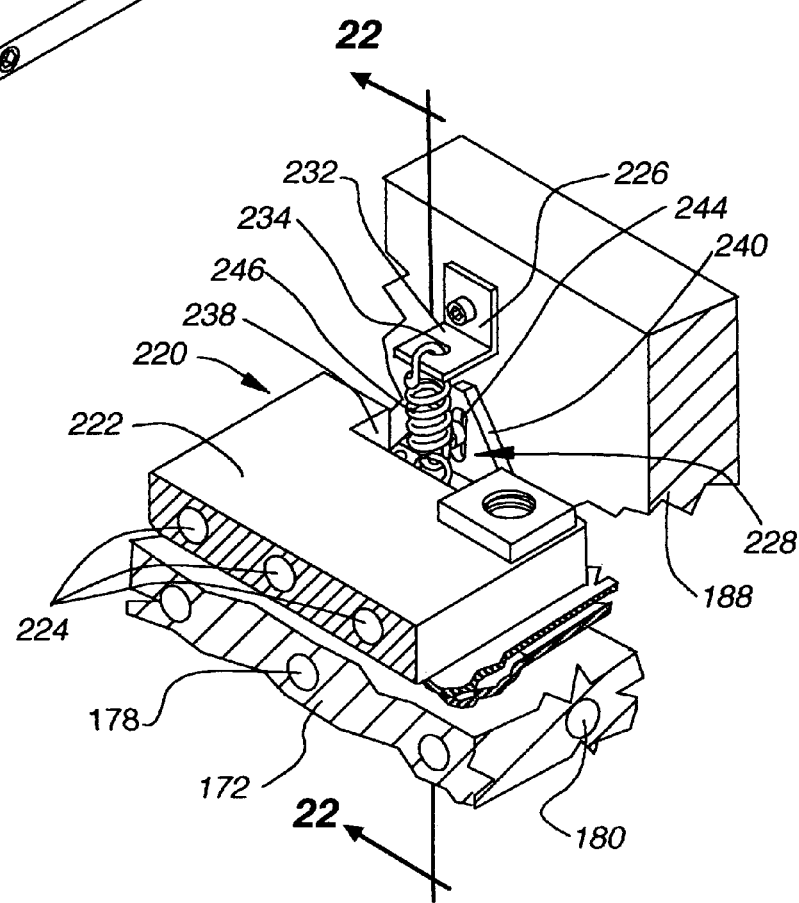
FIG. 21 is an enlarged fragmentary isometric looking at one end of the cooling element shown in FIG. 20 and its connection to the framework and the laminator.

With particular reference to FIGS. 20–22, the end of each cooling bar 220 is supported on the associated side wall 188 of the upper section of the pressure box by an upper 226 and lower 228 bracket and a spring/pin combination 230. The L-shaped upper bracket 226 is secured to the inner surface of the side wall 188 of the upper section of the pressure box and includes a horizontal leg 232 with an opening 234 therethrough. The lower bracket 228 is also of L-shaped transverse cross section having a lower leg 236 secured in a notch 238 provided in the upper side of the cooling bar with an upstanding leg 240 of the bracket being slidably connected with a fastener 242 to the inner surface of the side wall 188 of the upper section of the pressure box. The upstanding leg 240 of the lower bracket has an elongated slot 244 (FIG. 21) formed therein through which the fastener 242 extends and is slidably disposed so that the cooling bar can slide up and down or float through the relationship of the fastener with the slot 244 in the bracket. A support coil spring 246 is supported at its upper end in the opening 234 in the upper bracket and hangs downwardly where its opposite end supports a pin 248 that extends through a hole in the lower bracket and is threadedly secured in the notch 238 in the cooling bar. The overall at rest length of the non-extended coil spring and pin combination 230 establishes a desired suspended position for the cooling bar so that its lower surface lightly engages the inner surface of the upper drive belt 66 when no supply material 38 is positioned between the drive belts. When supply material is positioned between the drive belts, the increased effective thickness of the combined drive belts in combination with the supply material raises the cooling bar through its slidable lower bracket connection to the side wall and the coil spring allows this movement while yieldingly permitting a limited amount of downward movement. It will be appreciated from the above that each cooling bar is therefore yieldingly suspended from a side wall of the upper section of the pressure box so the weight of the cooling bar lightly rests on the underlying run of the upper drive belt.

Figure 12:
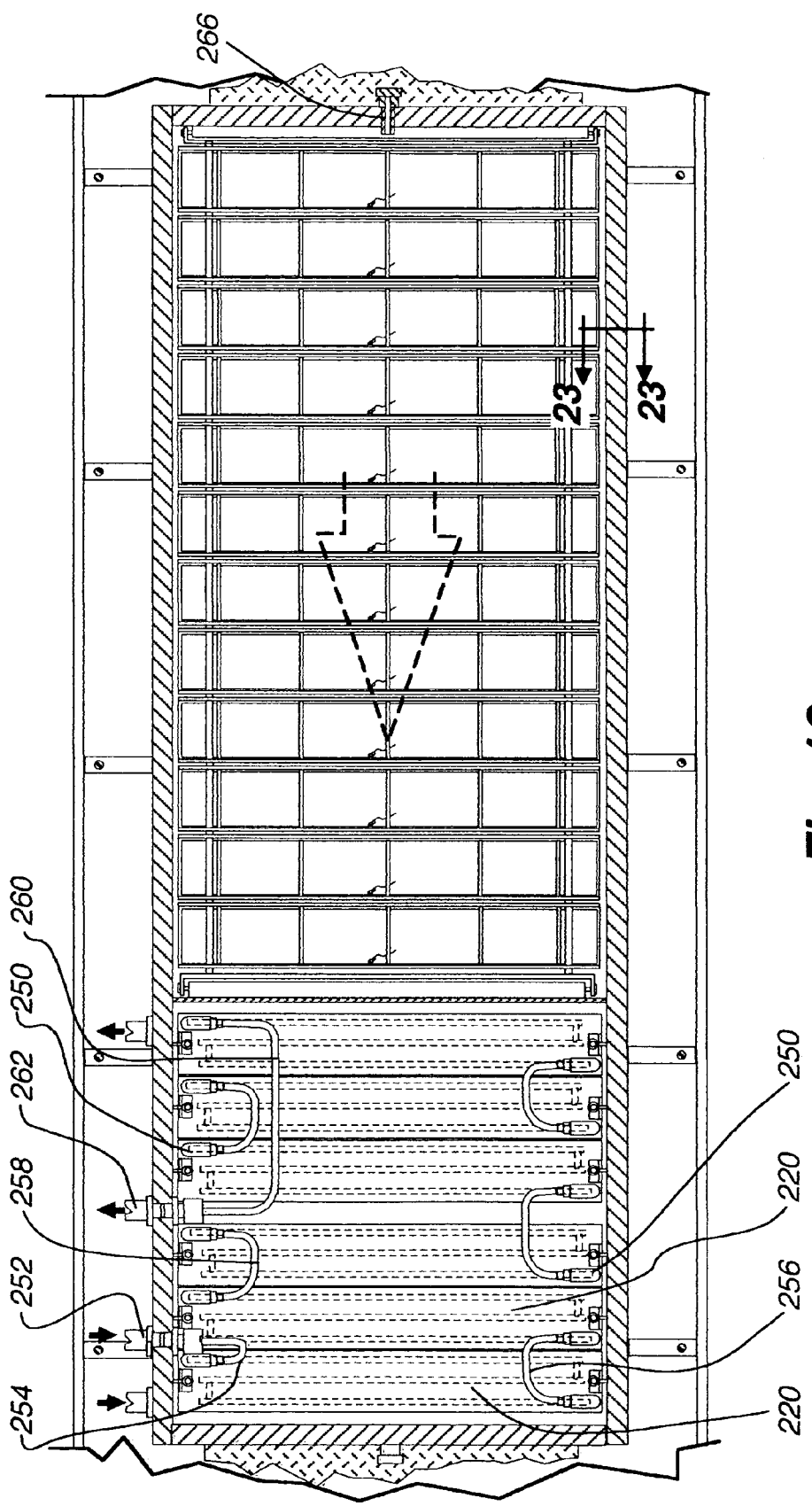
FIG. 12 is a fragmentary section taken along line 12—12 of FIG. 8.

With reference to FIGS. 12 and 13, each cooling bar 220 is operatively interconnected in a hydraulic system that includes a fitting 250 at each end of a cooling bar in fluid communication with the open ends of the three passages 224 that extend therethrough and interconnecting tubes which desirably pass cooling fluid from one cooling bar to another. For example, along the upper edge side wall 188, as viewed in FIG. 13, an inlet tube 252 through which coolant is admitted to the pressure box is connected by a connecting tube 254 to the fitting 250 at the upper end of the downstream-most cooling bar so that coolant fluid passes through the three channels in the downstream-most cooling bar downwardly toward the opposite side wall 188 where it can pass out of the fitting at that location and into a second cooling tube 256 which transfers the fluid to the next adjacent downstream cooling bar 220 through its fitting 250 adjacent to the lower side wall 188. The cooling fluid then passes upwardly toward the opposite side wall of the pressure box where it is collected in a fitting that is connected to still another connecting tube 258 which transfers the fluid to the upper side of the next adjacent downstream cooling bar so the fluid can pass downwardly toward the opposite side. It will be appreciated by following the connecting tubes as shown in FIG. 13 that the coolant is therefore passed in a serpentine path and in an upstream direction until it gets to the upstream-most cooling bar 220 from which the cooling fluid is removed at the upper side and passed through a final connecting tube 260 to an outlet connector 262 for removal from the pressure box. The continuous passage of cooling fluid into the inlet connector and out of the outlet connector allows heat to be removed from the cooling chamber 64 at the downstream end of the pressure box thereby cooling that end of the pressure box which in turn sets the adhesive which was previously melted in the heating chamber 62 at the upstream end of the pressure box to bond the supply material together.

Accordingly, when the laminate material exits from the exit or downstream end of the pressure box 70, the material is desirably laminated together and the adhesive has been cured or set before the laminate material is collected on the take-up roll 42. It will also be appreciated that since the supply material 38 is being pulled through the laminating station 34 at the same speed at which the drive belts 66, 68 are compressing the material, any stretching or distortion in the laminate material is avoided. Further, since the pressure on the supply material is established in a diaphragm type setting, uniform compression is permitted through the entire passage of the supply material through the laminating station.

With reference to FIGS. 8–11, the top plate or wall 194 of the upper section 72 of the pressure box and the bottom plate or wall 148 of the lower section of the pressure box are provided with pneumatic fittings 264 through which pressurized air can be injected into the upper and lower sections of the pressure box, respectively. It is desirable that the pressure be uniform in both the upper and lower sections of the pressure box and accordingly, the supply of pressurized air can come from the same source.

The upper and lower sections of the pressure box are also provided with a vent 266 to release pressure from the upper and lower sections of the pressure box when desired.

Figure 24:
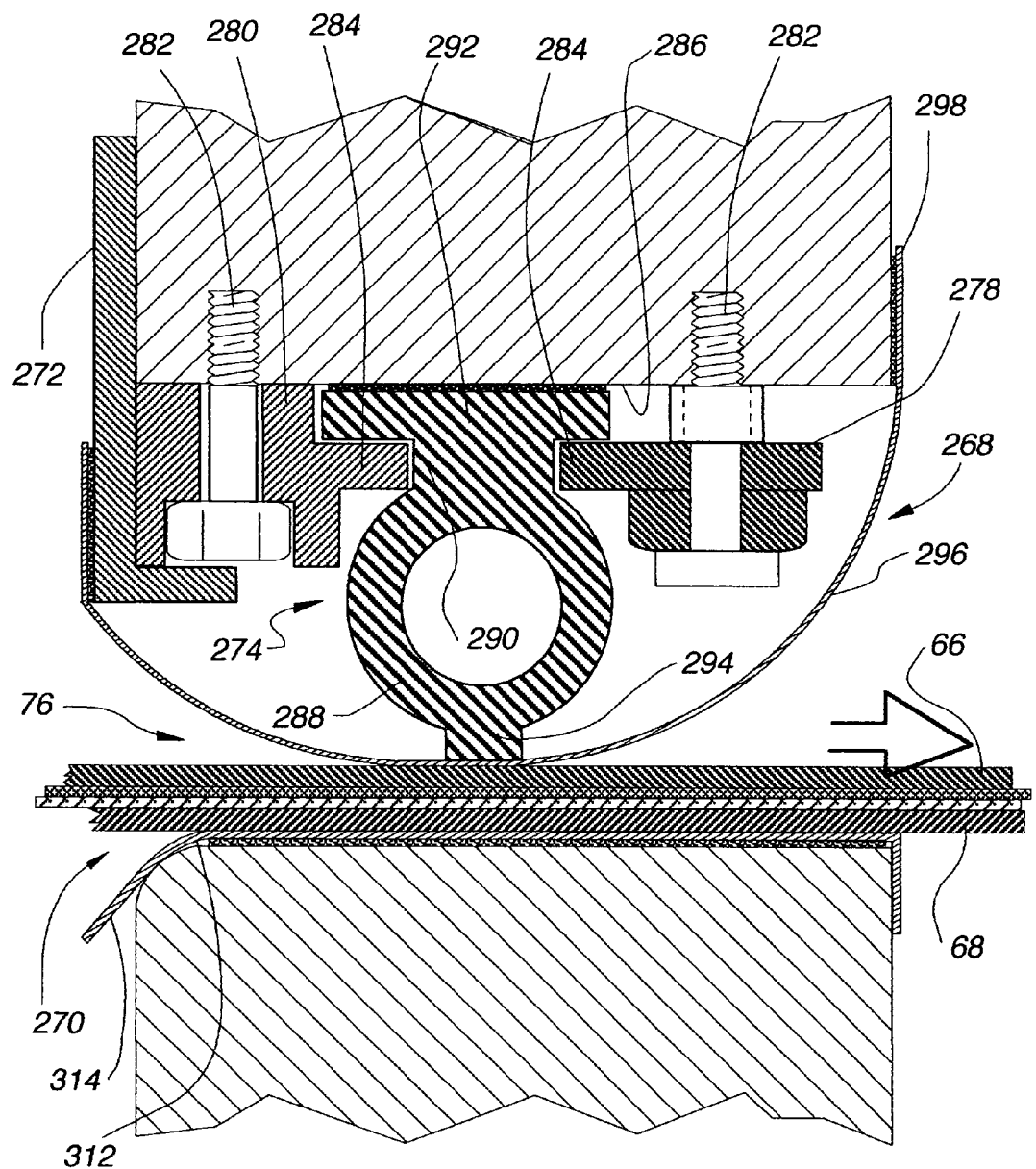
FIG. 24 is an enlarged fragmentary section taken along line 24—24 of FIG. 10.

As mentioned previously, a seal 76 is provided preferably around the juncture of the upper 72 and lower 74 sections of the pressure box to hermetically seal the upper and lower sections of the pressure box from each other in a manner such that the belts can slide along the seal 76 while retaining the hermetically sealed condition of the upper and lower sections of the pressure box. The seal is probably best illustrated in FIGS. 24–25 with FIG. 25 illustrating the seal along the side walls of the pressure box and FIG. 24 illustrating the seal at the inlet or outlet end of the pressure box.

Figure 25:
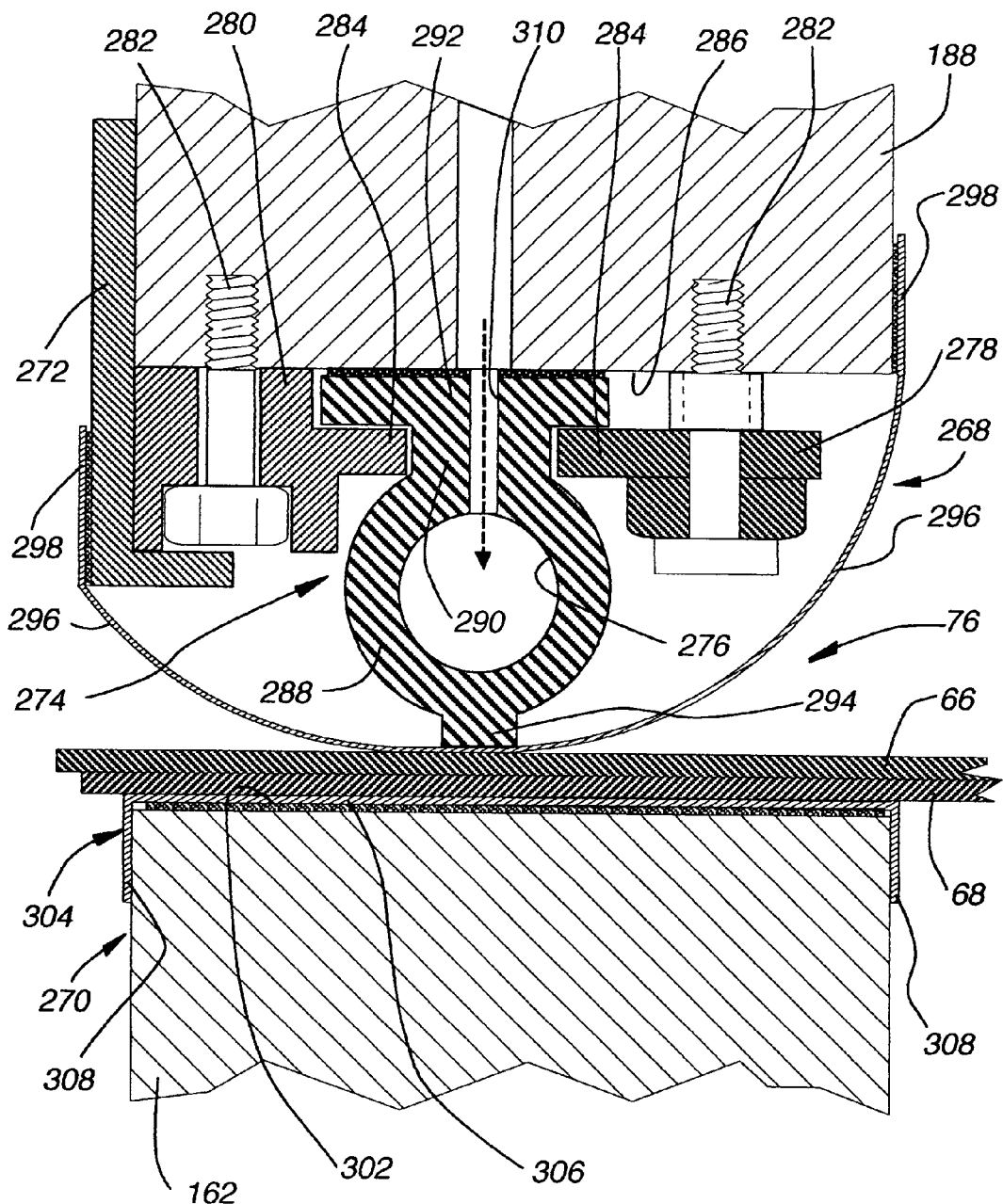
FIG. 25 is a vertical section illustrating the pneumatic seal used along the sides of the pressure box of the laminator.

Looking first at FIG. 25, it will be appreciated that the seal 76 includes an inflatable component 268 on the upper section 72 of the pressure box 70 and a slide plate component 270 on the lower section 74. The inflatable component is continuous around the periphery of the upper section and is mounted to the lower edge of the side 188 and end 190, 192 walls. A side wall mounting of the inflatable component of the seal is shown in FIG. 25 even though the end wall mounting is identical. The inflatable component 268 includes an L-shaped side bracket 272 extending the length of the side or end wall, an inflatable and flexible rubber or plastic bladder 274 having a longitudinally extending cylindrical passage 276 therethrough and inner 278 and outer 280 brackets secured to the lower edge of the upper side wall 188 to hold the bladder in a desired position. The inner and outer brackets extend longitudinally along the length of the side or end wall and are secured thereto with suitable fasteners 282. The brackets each include a flange or shelf 284 extending toward the opposite bracket so as to define a space between each other and between the shelf 284 and the lower edge 286 of the associated side wall 188. The bladder has a tubular main body 288 of generally circular transverse cross section through which the passage 276 extends and an upper neck 290 that supports a head 292 adapted to overlie the shelf portions 284 of each bracket. The neck 290 is sized to fit between the shelf portions of each bracket and the head 292 overlies the shelf portions of each bracket so once the brackets are secured to the lower edge of the side or end wall, the bladder is held in position. The lower edge of the bladder 274 has a longitudinally extending bead or rib 294 protruding downwardly from the tubular main body with this rib engaging the inner surface of a flexible, low-friction strip of material 296 which has one edge 298 secured to the inner face of the side wall 188 and its other edge 298 to the L-bracket 272 along the side wall 188 so as to define a generally bowed or arcuate transverse cross section which is convex downwardly. The strip 296 could be made of numerous low-friction materials, but in the preferred embodiment, it is made of stainless steel, aluminum, or Teflon®, i.e., PTFE coated plastic.

The upper edge 302 of the side walls 162 on the lower section 74 of the pressure box 70 which is vertically aligned with a side wall 188 on the upper section 72 of the pressure box has the slide plate component 270 of the seal in the form of a cap or strip 304 of a low friction material secured thereto as with an adhesive. The cap has an upper flat wall 306 and depending legs 308 along the inner and outer sides of the side wall 162 on which it is mounted with the cap also being made of a low friction material such as stainless steel, aluminum, or Teflon®, i.e., PTFE coated plastic.

As will be appreciated in FIG. 25, the upper and lower drive belts 66, 68 pass between the low friction strips of material 296 and 304 on the upper and lower side walls of the pressure box. The seal established by the pneumatic sealing system 76 is a cooperation between the inflatable bladder 274 and the predetermined set spacing between the upper 72 and lower 74 sections of the pressure box as determined by the spacings between the upper and lower sets of transverse beams 144, 142 described previously. The low friction strips allow free sliding movement of the belts therebetween without detrimentally affecting the hermetic seal established by the inflatable and slide plate components of the seal.

The passage 276 through the main body of the bladder is connected by a fitting 310 (FIG. 25) communicating with the passage, to a source of pressurized air (not shown) so that by increasing the pressure, the bladder inflates forcing the bead 194 against the inner surface of the low friction strip 296 on the upper side frame member and consequently against the underlying upper drive belt 66. The pressure further forces the upper and lower drive belts against each other and the lower drive belt against the slide plate strip 304 on the lower side wall. It will be appreciated that by selecting a desired spacing between the transverse beams 142, 144 and a desired inflation of the bladder 274 that a desired pressure can be applied to the side edges of the drive belts whereby the drive belts can easily slide within the pneumatic seal with low wear while still permitting an hermetic seal to retain the desired pressurization of the upper and lower sections of the pressure box.

With reference to FIG. 24, the same pneumatic seal 76 is illustrated as it exists on the upstream end or the downstream end of the pressure box 70. It will be appreciated the inflatable component 268 of the seal is identical to that previously described but the slide plate component 270 is slightly different. The end walls 158, 160 on the lower section 74 of the pressure box are champhered or curved along an outer edge 310 and the low friction cap or strip of material 312 is placed on the end wall so that one edge 314 of the strip is tapered downwardly rather than being wrapped around the end of the lower end wall. The tapered edge 314 on the inlet end wall is on the upstream side and the tapered edge on the exit end wall is on the downstream side. In this manner, the incoming upper and lower drive belts 66, 68 along with the supply material therebetween can enter the pressure box with very little abrasion or resistance from the low friction strips and again the pressure in the pneumatic seal between the upper and lower end walls can be regulated by the spacing between the transverse beams and the pressure within the inflatable bladder. It should be noted that the inflatable bladder is continuous around the periphery of the upper section of the pressure box so that the air pressure in the inflatable component is uniform around the periphery of the pressure box.

Advantageously, at least about 10%, preferably at least 25% and most preferably about 50% of the interior of the pressure box at the inlet end thereof is provided with heat bars and the remainder of the pressure box, again at least about 10%, preferably at least about 25% and most preferably about 50% of the box interior is provided with cooling bars. If desired, multiple zones of heating and cooling could be included within the pressure box. For example, heat/cool, heat/cool, etc.

When two or more supply rolls of material (for example, at least one warp substrate and at least one weft substrate) are laminated in the apparatus, the thickness of the laminate at the outlet end of the laminator is at least 5%, preferably at least 10%, and most preferably at least 20% less than the combined thickness of the substrates and adhesive as measured at the inlet end of the laminator.

A preferred rectangular pressure box has a pressure area of about 1500 sq. in. The drive belts, which are substantially nonporous, are pressurized from both sides of the pressure box with air (or another fluid medium) pressure of at least 2 psi, preferably at least 5 psi, and most preferably at least about 10 psi. Higher pressures can be achieved with modification of the equipment to support and sustain the same. This pressure applied to the belts is equivalent to a compressive weight (force) ranging from about 5000 lbs. to about 50,000 lbs. applied over the 1500 sq. in. area of the current pressure box. For laminating non-woven fabrics, as described previously, a compressive force from about 10,000 lbs. to about 25,000 lbs. is typical and a compressive force of about 15,000 lbs. (at 10 psi gauge) has been found to be especially preferred. This is important because in a traditional laminator, which uses top and bottom platens, if a weight of 15,000 lbs. was placed on the top platen to provide the compressive force to effect lamination, any belt running thereunder would likely break. Traditional high pressure laminators usually employ a series of actions; move, stop, press; move, stop, press; etc. when operating in a "continuous" manner.

The thickness of the drive belts can be modified as desired and depends on the nature of the materials being laminated in the desired operating speed in feet per minute (fpm). For laminating non-woven fabrics, a belt thickness ranging from 2 to 20 mil, preferably 5 to 15 mil has been found satisfactory. Belts of 14 mil thickness have been operated at 5 fpm with a temperature of 380° F. being delivered to the substrates. Belts of 5 mil thickness have been operated at 12 fpm with a temperature of 380° F. being delivered to the substrates. Optimum belt speeds of 50, 60, 70 . . . 100 fpm can be achieved by modification of the belt thickness and/or composition. The optimum belt speed for non-woven fabric lamination is currently believed to be 60 to 70 fpm. Another way in which to achieve higher speeds is to simply increase the size of the laminator apparatus. The current preferred apparatus has a length of about 4 ft. Increasing the size 2–10× would allow for faster operating speeds.

During the lamination process, the substrate material may create a counter-pressure as any entrapped air in the substrates expands. To deal with this counter-pressure, at least one or both of the drive belts used in the pressure laminator of the present invention can be modified on the outside edges to comprise a thick (about 0.125 in) porous glass fiber mat. This porous glass fiber mat allows the expanded air from the heated laminate to escape via the sideways (transverse) porosity. While the main body of the belts can be made of any desired material, a Teflon impregnated fiberglass material has been found desirable.

Although the present invention has been described with a certain degree of particularity, it is understood the disclosure has been made by way of example and changes in detail or structure may be made without departing from the spirit of the invention as defined in the appended claims.

The invention claimed is:

1. A pressure lamination apparatus comprising: a housing; a pressure box mounted on the housing, the pressure box comprising upper and lower confronting sections defining a lamination section having an inlet end and an outlet end and opposite sides, each of said upper and lower sections including a peripheral frame extending along said inlet end, outlet end and sides; counter-rotating upper and lower drive belts rotatably mounted on the housing so as to engage each other while passing from the inlet end to the outlet end through said lamination section; a fluid pressure generator for supplying fluid pressure to the upper and lower sections of the pressure box for compressing the drive belts together in the pressure box, and pressure seals between said upper and lower sections along said inlet end, outlet end and sides and between which said drive belts are adapted to slide, said pressure seals including a low friction surface along the frame of one of said upper and lower sections and a low friction flexible sheet having inner and outer surfaces on the frame of the other of said upper and lower sections, said flexible sheet defining a chamber along said frame of the other section, and an inflatable bladder in said chamber in engagement with said inner surface and adapted on inflation to flex said flexible sheet toward said low friction surface to seal said drive belts therebetween.

2. The apparatus of claim 1 wherein said inflatable bladder is resilient and includes an elongated hermetically sealed tubular body having a longitudinally extending external bead and wherein said bead is in engagement with said inner surface.

3. The apparatus of claim 1 or 2 wherein said flexible sheet is an elongated strip having longitudinal edges and is secured to said other frame along said longitudinal edges.

4. The apparatus of claim 3 wherein said sheet has a PTFE coating and said low friction surface is PTFE.

5. The apparatus of claim 2 wherein said bladder further includes at least one flange and wherein said other frame further includes a bracket system for cooperating with said at least one flange to secure said bladder to said other frame.

6. The apparatus of claim 4 wherein said low friction surface is on a sheet of material secured to said one frame.

7. The apparatus of claim 1 or 2 wherein said drive belts overlap said frames of said upper and lower sections along said inlet and outlet ends and said sides.

8. The apparatus of claim 7 wherein said belts are fluid impermeable.

9. The apparatus of claim 1 or 2 further including heating and cooling systems in said pressure box.

10. The apparatus of claim 9 wherein said heating system is closer to said inlet end than said cooling system.

11. The apparatus of claim 10 wherein said upper section has a heating system and said lower section has a heating system, said heating system in said upper section including a plurality of heating elements.

12. The apparatus of claim 11 wherein said heating elements are floating.

13. The apparatus of claim 11 wherein said heating system in said lower section is confined to a single plate.

14. The apparatus of claim 10 wherein said upper section has a cooling system and said lower section has a cooling system, said cooling system in said upper section including a plurality of cooling elements.

15. The apparatus of claim 14 wherein said cooling elements are floating.

16. The apparatus of claim 14 wherein said cooling system in said lower section is confined to a single plate.

17. The apparatus of claim 1 wherein said inflatable bladder is continuous around the periphery of said upper section.

18. The apparatus of claim 17 wherein said inflatable bladder is capable of producing uniform pressure around the periphery of said pressure box.

19. The apparatus of claim 18 wherein said pressure in said inflatable bladder is adjustable.

* * * * *